(12) United States Patent
Kim et al.

(10) Patent No.: US 10,985,234 B2
(45) Date of Patent: Apr. 20, 2021

(54) ORGANIC LIGHT EMITTING DIODE DISPLAY

(71) Applicant: SAMSUNG DISPLAY CO., LTD., Yongin-si (KR)

(72) Inventors: Se-Ho Kim, Yongin-si (KR); Jin-Woo Park, Yongin-si (KR); Won-Se Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/984,045

(22) Filed: Aug. 3, 2020

(65) Prior Publication Data

US 2020/0365678 A1  Nov. 19, 2020

Related U.S. Application Data

(63) Continuation of application No. 16/659,372, filed on Oct. 21, 2019, now Pat. No. 10,734,470, which is a (Continued)

(30) Foreign Application Priority Data

Aug. 2, 2012 (KR) .................. 10-2012-0084976

(51) Int. Cl.
*H01L 27/32* (2006.01)
*G09G 3/3225* (2016.01)
*H01L 27/12* (2006.01)

(52) U.S. Cl.
CPC ...... *H01L 27/3276* (2013.01); *H01L 27/3248* (2013.01); *H01L 27/3258* (2013.01); (Continued)

(58) Field of Classification Search
CPC .................................................. H01L 27/3297
See application file for complete search history.

(56) References Cited

U.S. PATENT DOCUMENTS

| 5,929,464 A | 7/1999 | Yamazaki et al. |
| 6,914,642 B2 | 7/2005 | Yamazaki et al. |

(Continued)

FOREIGN PATENT DOCUMENTS

| CN | 1917205 A | 2/2007 |
| CN | 101110422 A | 1/2008 |

(Continued)

OTHER PUBLICATIONS

SIPO Office Action dated Dec. 14, 2016, for corresponding Chinese Patent Application No. 201310331836.5 (5 pages).

(Continued)

*Primary Examiner* — Lex H Malsawma
(74) *Attorney, Agent, or Firm* — Lewis Roca Rothgerber Christie LLP

(57) ABSTRACT

An organic light emitting diode display includes a substrate, a scan line on the substrate for transferring a scan signal, a data line crossing the scan line and for transferring a data signal, a driving voltage line crossing the scan line and for transferring a driving voltage, a switching thin film transistor coupled to the scan line and the data line, a driving thin film transistor coupled to a switching drain electrode of the switching thin film transistor, and an organic light emitting diode (OLED) coupled to a driving drain electrode of the driving thin film transistor, wherein a driving semiconductor layer of the driving thin film transistor is bent and in a plane substantially parallel to the substrate.

32 Claims, 11 Drawing Sheets

Related U.S. Application Data continuation of application No. 16/261,450, filed on Jan. 29, 2019, now Pat. No. 10,483,342, which is a continuation of application No. 15/900,715, filed on Feb. 20, 2018, now Pat. No. 10,204,976, which is a continuation of application No. 15/603,309, filed on May 23, 2017, now Pat. No. 9,899,464, which is a continuation of application No. 15/238,449, filed on Aug. 16, 2016, now Pat. No. 9,660,012, which is a continuation of application No. 13/952,508, filed on Jul. 26, 2013, now Pat. No. 9,450,040.

(52) U.S. Cl.
CPC ...... *H01L 27/3262* (2013.01); *H01L 27/3265* (2013.01); *H01L 27/3297* (2013.01); *G09G 3/3225* (2013.01); *G09G 2300/0809* (2013.01); *H01L 27/124* (2013.01); *H01L 27/1255* (2013.01)

(56) References Cited

U.S. PATENT DOCUMENTS

| | | | |
|---|---|---|---|
| 7,649,202 B2 | 1/2010 | Lee | |
| 8,878,827 B2 | 11/2014 | Han et al. | |
| 9,450,040 B2 | 9/2016 | Kim et al. | |
| 10,204,976 B2 | 2/2019 | Kim et al. | |
| 10,483,342 B2 | 11/2019 | Kim et al. | |
| 10,734,470 B2 * | 8/2020 | Kim | H01L 27/3262 |
| 2003/0222589 A1 | 12/2003 | Osame et al. | |
| 2004/0155242 A1 | 8/2004 | Segawa et al. | |
| 2006/0082524 A1 | 4/2006 | Kwon | |
| 2007/0040193 A1 | 2/2007 | Ajiki | |
| 2007/0159565 A1 | 7/2007 | Segawa et al. | |
| 2008/0017866 A1 | 1/2008 | Sato | |
| 2008/0129664 A1 | 6/2008 | Lin et al. | |
| 2010/0079361 A1 | 4/2010 | Lee et al. | |
| 2010/0253710 A1 | 10/2010 | Rankov et al. | |
| 2011/0273419 A1 | 11/2011 | Park | |
| 2012/0026146 A1 | 2/2012 | Kim | |
| 2012/0146004 A1 | 6/2012 | Lee et al. | |
| 2012/0162275 A1 | 6/2012 | Park | |
| 2012/0313100 A1 | 12/2012 | Liu et al. | |
| 2013/0334508 A1 | 12/2013 | Moon | |
| 2014/0001445 A1 | 1/2014 | Kim | |
| 2014/0027728 A1 | 1/2014 | Yoon et al. | |
| 2014/0070184 A1 | 3/2014 | Shin | |
| 2014/0077176 A1 | 3/2014 | Lee et al. | |
| 2014/0098078 A1 | 4/2014 | Jeon et al. | |

FOREIGN PATENT DOCUMENTS

| | | |
|---|---|---|
| CN | 101673508 A | 3/2010 |
| CN | 102117598 A | 7/2011 |
| CN | 102194404 A | 9/2011 |
| CN | 102386209 A | 3/2012 |
| CN | 102456318 A | 5/2012 |
| EP | 2402932 A1 | 1/2012 |
| JP | 2002-215096 A | 7/2002 |
| JP | 2003-295793 A | 10/2003 |
| JP | 2004-165241 A | 6/2004 |
| JP | 2005-134838 A | 5/2005 |
| JP | 2005-316384 A | 11/2005 |
| JP | 2006-11376 A | 1/2006 |
| JP | 2006-65308 A | 3/2006 |
| JP | 2006-65322 A | 3/2006 |
| JP | 2007-140488 A | 6/2007 |
| JP | 2008-46619 A | 2/2008 |
| JP | 2010-19950 A | 1/2010 |
| JP | 2011-507005 A | 3/2011 |
| JP | 2012-14136 A | 1/2012 |
| JP | 2012-133170 A | 7/2012 |
| KR | 10-1999-0066077 | 8/1999 |
| KR | 10-0297868 B1 | 10/2001 |
| KR | 10-0439944 B1 | 11/2004 |
| KR | 10-2007-0074748 A | 7/2007 |
| KR | 10-2009-0119599 | 11/2009 |
| WO | WO 2007/111202 A1 | 10/2007 |
| WO | WO 2009/056877 A1 | 5/2009 |

OTHER PUBLICATIONS

JPO Office Action dated Dec. 20, 2016, for corresponding Japanese Patent Application No. 2013-026588 (8 pages).

Korean Patent Abstract, Publication No. 10-2000-0038925 A, dated May 7, 2000 for corresponding Korean Patent 10-0439944 listed above (2 pages).

European Search Report dated Oct. 28, 2015, for corresponding European Patent Application No. 13179090.9 (9 pages).

European Search Report dated Nov. 12, 2015, for corresponding European Patent Application No. 13179091.7 (10 pages).

EPO Office Action dated Dec. 5, 2017, for corresponding European Patent Application No. 13179090.9 (4 pages).

* cited by examiner

ORGANIC LIGHT EMITTING DIODE DISPLAY

CROSS-REFERENCE TO RELATED APPLICATIONS

This application is a continuation of U.S. patent application Ser. No. 16/659,372, filed Oct. 21, 2019, which is a continuation of U.S. patent application Ser. No. 16/261,450, filed Jan. 29, 2019, now U.S. Pat. No. 10,483,342, which is a continuation of U.S. patent application Ser. No. 15/900,715, filed Feb. 20, 2018, now U.S. Pat. No. 10,204,976, which is a continuation of U.S. patent application Ser. No. 15/603,309, filed May 23, 2017, now U.S. Pat. No. 9,899,464, which is a continuation of U.S. patent application Ser. No. 15/238,449, filed Aug. 16, 2016, now U.S. Pat. No. 9,660,012, which is a continuation of U.S. patent application Ser. No. 13/952,508, filed Jul. 26, 2013, now U.S. Pat. No. 9,450,040, which claims priority to and the benefit of Korean Patent Application No. 10-2012-0084976 filed in the Korean Intellectual Property Office on Aug. 2, 2012, the entire content of all of which are incorporated herein by reference.

BACKGROUND

1. Field

The described technology relates generally to an organic light emitting diode display.

2. Description of Related Art

An organic light emitting diode display includes two electrodes and an organic emission layer interposed therebetween, electrons injected from one electrode and holes injected from the other electrode are combined with each other in the organic emission layer to form an exciton, and light is emitted while the exciton discharges energy.

The organic light emitting diode display includes a plurality of pixels, each including an organic light emitting diode that is a self-light emitting element, and a plurality of thin film transistors and capacitors for driving the organic light emitting diode. The plurality of thin film transistors includes a switching thin film transistor and a driving thin film transistor.

In the switching thin film transistor, a thin gate insulating layer is formed between a gate electrode and a semiconductor layer to enable rapid switching operation. Because the thickness of the gate insulating layer of the driving thin film transistor, which is formed on the same layer as the switching thin film transistor, is reduced, a driving range of a gate voltage applied to the gate electrode of the driving thin film transistor becomes narrow. Therefore, it may be difficult to control the magnitude of the gate voltage Vgs of the driving thin film transistor to ensure a large number of gray levels.

The above information disclosed in this Background section is only for enhancement of understanding of the background of the described technology, and may therefore contain information that does not form the prior art that is already known in this country to a person of ordinary skill in the art.

SUMMARY

The described technology provides an organic light emitting diode display broadening a driving range of a driving thin film transistor to display a relatively large number of gray levels.

An exemplary embodiment of the present invention provides an organic light emitting diode display including a substrate, a scan line on the substrate for transferring a scan signal, a data line crossing the scan line and for transferring a data signal, a driving voltage line crossing the scan line and for transferring a driving voltage, a switching thin film transistor coupled to the scan line and the data line, a driving thin film transistor coupled to a switching drain electrode of the switching thin film transistor, and an organic light emitting diode (OLED) coupled to a driving drain electrode of the driving thin film transistor, wherein a driving semiconductor layer of the driving thin film transistor is bent and in a plane substantially parallel to the substrate.

The organic light emitting diode display may further include a first gate insulating layer covering the driving semiconductor layer, and a storage capacitor at the first gate insulating layer and overlapping the driving semiconductor layer.

The storage capacitor may include a first storage capacitor plate at the first gate insulating layer and overlapping the driving semiconductor layer, a second gate insulating layer covering the first storage capacitor plate, and a second storage capacitor plate at the second gate insulating layer and overlapping the first storage capacitor plate.

The driving semiconductor layer may include a plurality of bent portions.

The driving semiconductor layer may include a plurality of first extension portions extending in a first direction, and a plurality of second extension portions extending in a second direction that is different from the first direction, and wherein the bent portions couple respective ones of the first extension portions and the second extension portions.

The organic light emitting diode display may further include a compensation thin film transistor coupled to the driving thin film transistor and for compensating a threshold voltage of the driving thin film transistor.

The driving semiconductor layer may further include branched portions branched from the bent portions.

The storage capacitor may overlap the branched portions.

The organic light emitting diode display may further include a light emission control line for transferring a light emission control signal, and a light emission control thin film transistor configured to be turned on by the light emission control signal to transfer the driving voltage from the driving thin film transistor to the OLED, wherein the light emission control thin film transistor is between the driving drain electrode and the OLED.

The organic light emitting diode display may further include a transistor connection portion for coupling a compensation source electrode of the compensation thin film transistor to a light emission control source electrode of the light emission control thin film transistor, wherein the storage capacitor extends to overlap the transistor connection portion.

The driving semiconductor layer may extend to overlap the transistor connection portion.

The organic light emitting diode display may further include an interlayer insulating layer on the second gate insulating layer, wherein the transistor connection portion is at a same layer as the data line, and is coupled through a contact hole in the interlayer insulating layer to the compensation source electrode and the light emission control source electrode.

The driving semiconductor layer may include a first path semiconductor layer coupled to the compensation thin film transistor, and a second path semiconductor layer coupled to the light emission control thin film transistor, and a length of the first path semiconductor layer may be smaller than a length of the second path semiconductor layer.

The storage capacitor may overlap the first path semiconductor layer and the second path semiconductor layer.

The organic light emitting diode display may further include an interlayer insulating layer covering the second storage capacitor plate, a connection member at the interlayer insulating layer and coupled to the first storage capacitor plate through a first contact hole in the second gate insulating layer and the interlayer insulating layer, and a protective layer covering the interlayer insulating layer and the connection member, wherein the connection member is coupled to a compensation drain electrode of the compensation thin film transistor.

The scan line is at a same layer as the first storage capacitor plate, and the data line and the driving voltage line may be at a same layer as the connection member.

The driving voltage line may be coupled through a second contact hole in the interlayer insulating layer to the second storage capacitor plate.

The organic light emitting diode display may further include an operation control thin film transistor configured to be turned on by the light emission control signal transferred by the light emission control line to transfer the driving voltage to the driving thin film transistor, wherein the operation control thin film transistor is between the driving voltage line and a driving source electrode of the driving thin film transistor.

The organic light emitting diode display may further include a prior scan line for transferring a prior scan signal, an initialization voltage line for transferring an initialization voltage to the driving thin film transistor, and an initialization thin film transistor configured to be turned on according to the prior scan signal to transfer the initialization voltage to a driving gate electrode of the driving thin film transistor, wherein the initialization thin film transistor is between the driving gate electrode and the initialization voltage line.

The organic light emitting diode display may further include a bypass control line for transferring a bypass control signal, and a bypass thin film transistor for transferring a portion of a driving current transferred by the driving thin film transistor according to the bypass control signal, wherein the bypass thin film transistor is between the initialization voltage line and a light emission control drain electrode of the light emission control thin film transistor.

Another exemplary embodiment of the present invention provides an organic light emitting diode display including a substrate, a scan line on the substrate for transferring a scan signal, an initialization voltage line on the substrate for transferring an initialization voltage, a data line crossing the scan line for transferring a data signal, a driving voltage line crossing the scan line for transferring a driving voltage, a switching thin film transistor coupled to the scan line and the data line, a driving thin film transistor coupled to a switching drain electrode of the switching thin film transistor, an organic light emitting diode (OLED) coupled to a driving drain electrode of the driving thin film transistor, a light emission control thin film transistor between the driving drain electrode and the OLED, and a bypass thin film transistor between the initialization voltage line and a light emission control drain electrode of the light emission control thin film transistor, wherein the bypass thin film transistor transfers a portion of a driving current transferred by the driving thin film transistor according to a bypass control signal transferred by a bypass control line.

A driving semiconductor layer of the driving thin film transistor is bent and in a plane substantially parallel to the substrate.

The organic light emitting diode display may further include a first gate insulating layer covering the driving semiconductor layer, and a storage capacitor at the first gate insulating layer and overlapping the driving semiconductor layer.

The storage capacitor may include a first storage capacitor plate at the first gate insulating layer and overlapping the driving semiconductor layer, a second gate insulating layer covering the first storage capacitor plate, and a second storage capacitor plate at the second gate insulating layer and overlapping the first storage capacitor plate.

The driving semiconductor layer may include a plurality of bent portions.

The driving semiconductor layer may include a plurality of first extension portions extending in a first direction, and a plurality of second extension portions extending in a second direction that is different from the first direction. The bent portions may couple respective ones of the first extension portions and the second extension portions.

The organic light emitting diode display may further include a compensation thin film transistor coupled to the driving thin film transistor and for compensating the threshold voltage of the driving thin film transistor.

The organic light emitting diode display may further include an interlayer insulating layer covering the second storage capacitor plate, a connection member at the interlayer insulating layer and coupled to the first storage capacitor plate through a first contact hole in the second gate insulating layer and the interlayer insulating layer, and a protective layer covering the interlayer insulating layer and the connection member, The connection member may be coupled to a compensation drain electrode of the compensation thin film transistor.

The scanline may be at a same layer as the first storage capacitor plate, and the data line and the driving voltage line may be at a same layer as the connection member.

The driving voltage line may be coupled to the second storage capacitor plate through a second contact hole in the interlayer insulating layer.

According to an exemplary embodiment of the present invention, since a driving channel region of a driving semiconductor layer may be longitudinally formed by forming the driving semiconductor layer including a plurality of bent portions, a driving range of a gate voltage applied to a driving gate electrode may be broadened.

Therefore, since the driving range of the gate voltage is relatively broad, a gray level of light emitted from an organic light emitting diode (OLED) can be more precisely controlled by adjusting the magnitude of the gate voltage, and as a result, it is possible to increase a resolution of the organic light emitting diode display and to improve display quality.

Further, it is possible to sufficiently ensure storage capacitance even at a high resolution by forming a storage capacitor overlapping the driving semiconductor layer to ensure a region of the storage capacitor, which is reduced by the driving semiconductor layer having the bent portion.

Further, it is possible to avoid or prevent low gray level stains by setting a length of a first path semiconductor layer coupled to a compensation thin film transistor to be smaller than a length of a second path semiconductor layer coupled to a light emission control thin film transistor.

DETAILED DESCRIPTION

Figure 1:
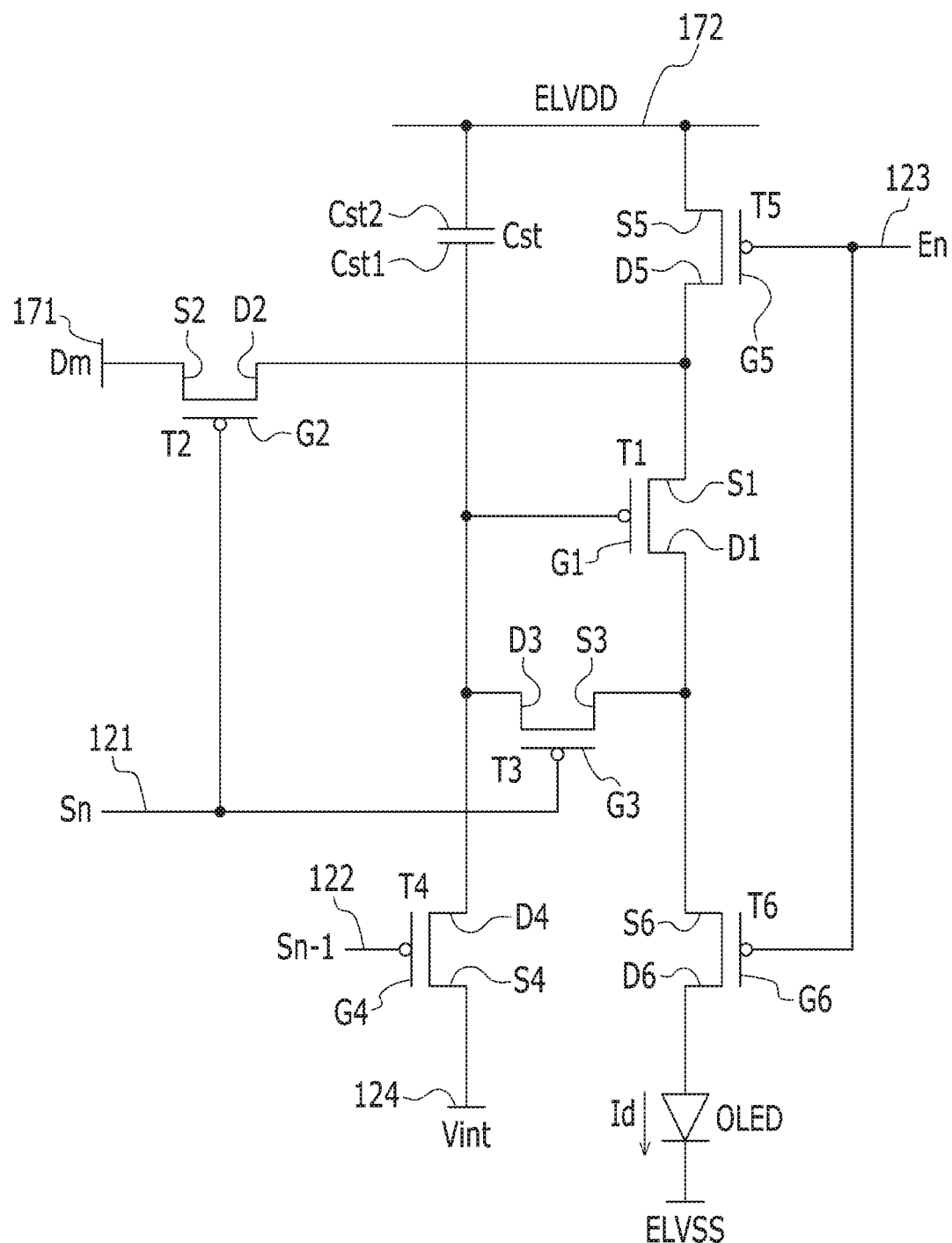
FIG. 1 is an equivalent circuit of one pixel of an organic light emitting diode display according to a first exemplary embodiment of the present invention.

Hereinafter, embodiments of the present invention will be described more fully with reference to the accompanying drawings, in which exemplary embodiments of the invention are shown. As those skilled in the art would realize, the described embodiments may be modified in various ways, all without departing from the spirit or scope of the present invention.

To describe embodiments of the present invention, portions that do not relate to the description are omitted, and same or like constituent elements are designated by same reference numerals throughout the specification.

In addition, the size and thickness of each component shown in the drawings may be arbitrarily shown for understanding and ease of description, but the present invention is not limited thereto. In the drawings, the thickness of layers, films, panels, regions, areas, etc., may be exaggerated for clarity, for understanding, and for ease of description. It will be understood that when an element such as a layer, film, region, or substrate is referred to as being "on" another element, it can be directly on the other element, or intervening elements may be present.

In addition, unless explicitly described to the contrary, the word "comprise" and variations thereof, such as "comprises" or "comprising", will be understood to imply the inclusion of stated elements, but not necessarily to the exclusion of other elements. Further, in the specification, the word "on" means positioning on or below the object portion, but does not necessarily mean positioning on the upper side of the object portion based on a direction of gravity.

An organic light emitting diode display according to a first exemplary embodiment will be described in detail with reference to FIGS. 1 to 5.

FIG. 1 is an equivalent circuit of one pixel of an organic light emitting diode display according to a first exemplary embodiment. As shown in FIG. 1, one pixel of the organic light emitting diode display according to the first exemplary embodiment includes a plurality of signal lines 121, 122, 123, 124, 171, and 172, a plurality of thin film transistors T1, T2, T3, T4, T5, and T6, a storage capacitor Cst, and an OLED coupled to the plurality of signal lines.

The plurality of thin film transistors includes a driving thin film transistor T1, a switching thin film transistor T2, a compensation thin film transistor T3, an initialization thin film transistor T4, an operation control thin film transistor T5, and a light emission control thin film transistor T6.

The plurality of signal lines includes a scan line 121 for transferring a scan signal Sn, a prior scan line 122 for transferring a prior scan signal Sn-1 to the initialization thin film transistor T4, a light emission control line 123 for transferring a light emission control signal En to the operation control thin film transistor T5 and the light emission control thin film transistor T6, a data line 171 crossing the scan line 121 and for transferring a data signal Dm, a driving voltage line 172 for transferring a driving voltage ELVDD and formed to be almost parallel to the data line 171, and an initialization voltage line 124 for transferring an initialization voltage Vint for initializing the driving thin film transistor T1.

A gate electrode G1 of the driving thin film transistor T1 is coupled to an end Cst1 of the storage capacitor Cst, a source electrode S1 of the driving thin film transistor T1 is coupled via the operation control thin film transistor T5 to the driving voltage line 172, a drain electrode D1 of the driving thin film transistor T1 is electrically coupled via the light emission control thin film transistor T6 to an anode of the OLED. The driving thin film transistor T1 receives the data signal Dm according to switching operation of the switching thin film transistor T2 to supply a driving current Id to the OLED.

A gate electrode G2 of the switching thin film transistor T2 is coupled to the scan line 121, a source electrode S2 of the switching thin film transistor T2 is coupled to the data line 171, a drain electrode D2 of the switching thin film transistor T2 is coupled via the operation control thin film transistor T5 to the driving voltage line 172 while being coupled to the source electrode S1 of the driving thin film transistor T1. The switching thin film transistor T2 is turned on according to the scan signal Sn transferred through the scan line 121 to perform a switching operation for transferring the data signal Dm transferred to the data line 171 to the source electrode of the driving thin film transistor T1.

A gate electrode G3 of the compensation thin film transistor T3 is coupled to the scan line 121, a source electrode S3 of the compensation thin film transistor T3 is coupled via the light emission control thin film transistor T6 to the anode of the OLED while being coupled to the drain electrode D1 of the driving thin film transistor T1, and a drain electrode D3 of the compensation thin film transistor T3 is coupled to an end Cst1 of the storage capacitor Cst, a drain electrode D4 of the initialization thin film transistor T4, and the gate electrode G1 of the driving thin film transistor T1 together. The compensation thin film transistor T3 is turned on according to the scan signal Sn transferred through the scan line 121 to couple the gate electrode G1 and the drain electrode D1 of the driving thin film transistor T1 to each other, thus performing diode-connection of the driving thin film transistor T1.

A gate electrode G4 of the initialization thin film transistor T4 is coupled to the prior scan line 122, a source electrode S4 of the initialization thin film transistor T4 is coupled to the initialization voltage line 124, and a drain electrode D4 of the initialization thin film transistor T4 is coupled to the end Cst1 of the storage capacitor Cst, the drain electrode D3 of the compensation thin film transistor T3, and the gate electrode G1 of the driving thin film transistor T1. The initialization thin film transistor T4 is turned on according to the prior scan signal Sn-1 transferred through the prior scan line 122 to transfer the initialization voltage Vint to the gate electrode G1 of the driving thin film transistor T1, thus performing an initialization operation for initializing the voltage of the gate electrode G1 of the driving thin film transistor T1.

A gate electrode G5 of the operation control thin film transistor T5 is coupled to the light emission control line 123, a source electrode S5 of the operation control thin film transistor T5 is coupled to the driving voltage line 172, and a drain electrode D5 of the operation control thin film transistor T5 is coupled to the source electrode S1 of the driving thin film transistor T1 and the drain electrode S2 of the switching thin film transistor T2.

A gate electrode G6 of the light emission control thin film transistor T6 is coupled to the light emission control line 123, a source electrode S6 of the light emission control thin film transistor T6 is coupled to the drain electrode D1 of the driving thin film transistor T1 and to the source electrode S3 of the compensation thin film transistor T3, and a drain electrode D6 of the light emission control thin film transistor T6 is electrically coupled to the anode of the OLED. The operation control thin film transistor T5 and the light emission control thin film transistor T6 are concurrently (e.g., simultaneously) turned on according to the light emission control signal En transferred through the light emission control line 123 to transfer the driving voltage ELVDD to the OLED, thus allowing a driving current Id to flow in the OLED.

Another end Cst2 of the storage capacitor Cst is coupled to the driving voltage line 172, and a cathode of the OLED is coupled to a common voltage ELVSS. Accordingly, the OLED receives the driving current Id from the driving thin film transistor T1 to emit light, thereby displaying an image.

Hereinafter, operation of one pixel of the organic light emitting diode display according to the first exemplary embodiment will be described in detail.

First, a prior scan signal Sn-1 of a low level is supplied through the prior scan line 122 during an initialization period. Then, the initialization thin film transistor T4 is turned on corresponding to the prior scan signal Sn-1 of a low level, and the initialization voltage Vint is provided from the initialization voltage line 124 through the initialization thin film transistor T4 to the gate electrode G1 of the driving thin film transistor T1 to initialize the driving thin film transistor T1 with the initialization voltage Vint.

Subsequently, a low level scan signal Sn is supplied through the scan line 121 during a data programming period. Then, the switching thin film transistor T2 and the compensation thin film transistor T3 are turned on corresponding to a low level scan signal Sn, thereby causing the driving thin film transistor T1 to be diode-coupled by the turned on compensation thin film transistor T3, and biased in a forward direction.

Then, a compensation voltage Dm+Vth (Vth is a negative value), which is obtained by subtracting the threshold voltage Vth of the driving thin film transistor T1 from the data signal Dm supplied from the data line 171, is applied to the gate electrode G1 of the driving thin film transistor T1.

The driving voltage ELVDD and the compensation voltage Dm+Vth are applied to both ends Cst1 and Cst2 of the storage capacitor Cst, and a charge corresponding to a difference between voltages at both ends Cst1 and Cst2 is stored in the storage capacitor Cst. Subsequently, the level of the light emission control signal En supplied from the light emission control line 123 during the light emission period is changed from a high level to a low level. Then, the operation control thin film transistor T5 and the light emission control thin film transistor T6 are turned on by a low level light emission control signal En during the light emission period.

Then, the driving current Id is generated according to a difference between the voltage of the gate electrode G1 of the driving thin film transistor T1 and the driving voltage ELVDD, and the driving current Id is supplied through the light emission control thin film transistor T6 to the OLED. The gate-source voltage Vgs of the driving thin film transistor T1 is maintained at '(Dm+Vth)−ELVDD' by the storage capacitor Cst during the light emission period, and the driving current Id is proportional to a square of a difference between the threshold voltage and the source-gate voltage, that is, the driving current Id is proportional to '(Dm−ELVDD)$^2$', according to a current-voltage relationship of the driving thin film transistor T1. Accordingly, the driving current Id is determined regardless of the threshold voltage Vth of the driving thin film transistor T1.

Figure 2:
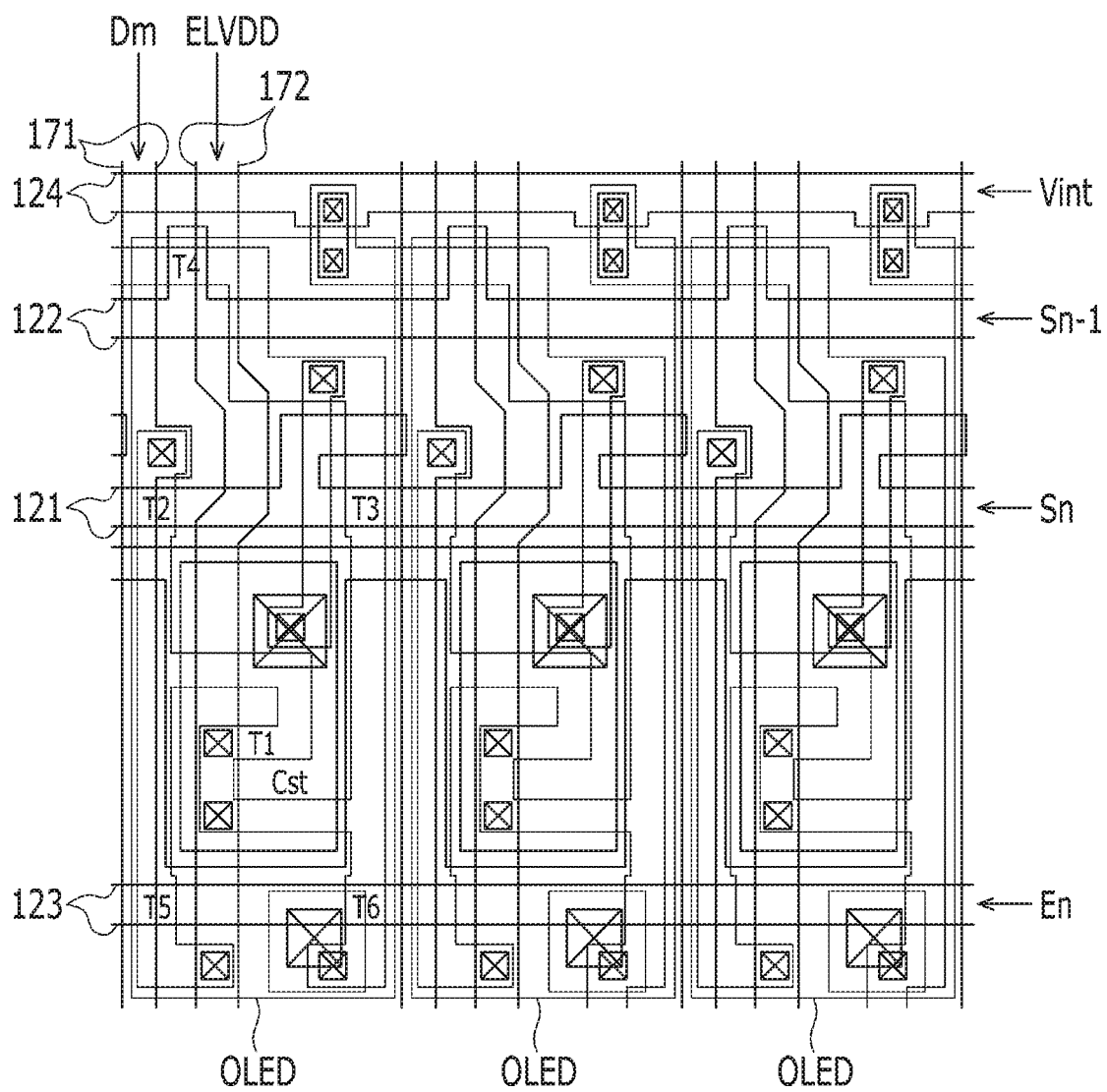
FIG. 2 is a view schematically showing positions of a plurality of thin film transistors and capacitors of the organic light emitting diode display according to the first exemplary embodiment.
Figure 3:
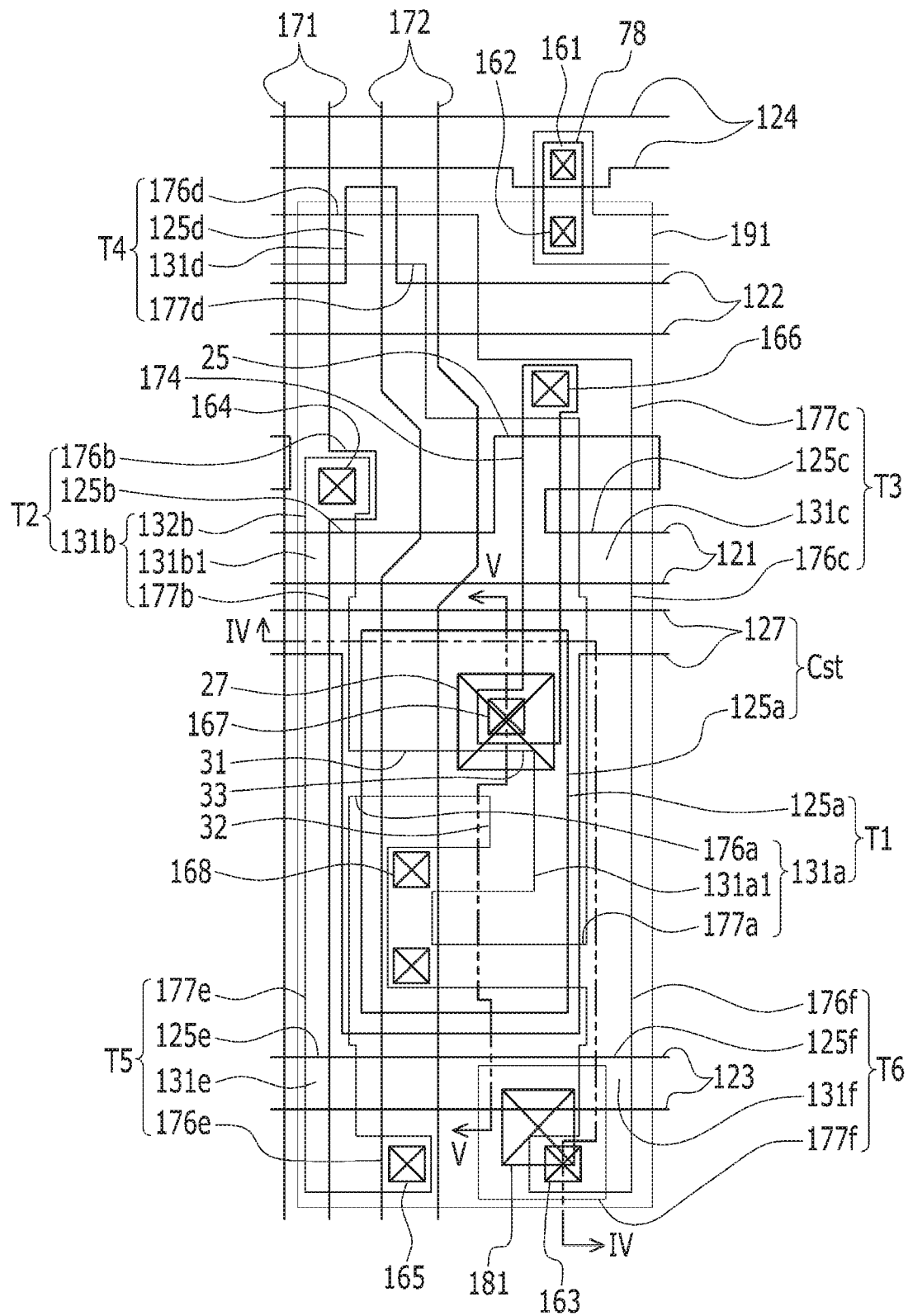
FIG. 3 is a layout view of one pixel of the organic light emitting diode display according to the first exemplary embodiment.
Figure 4:
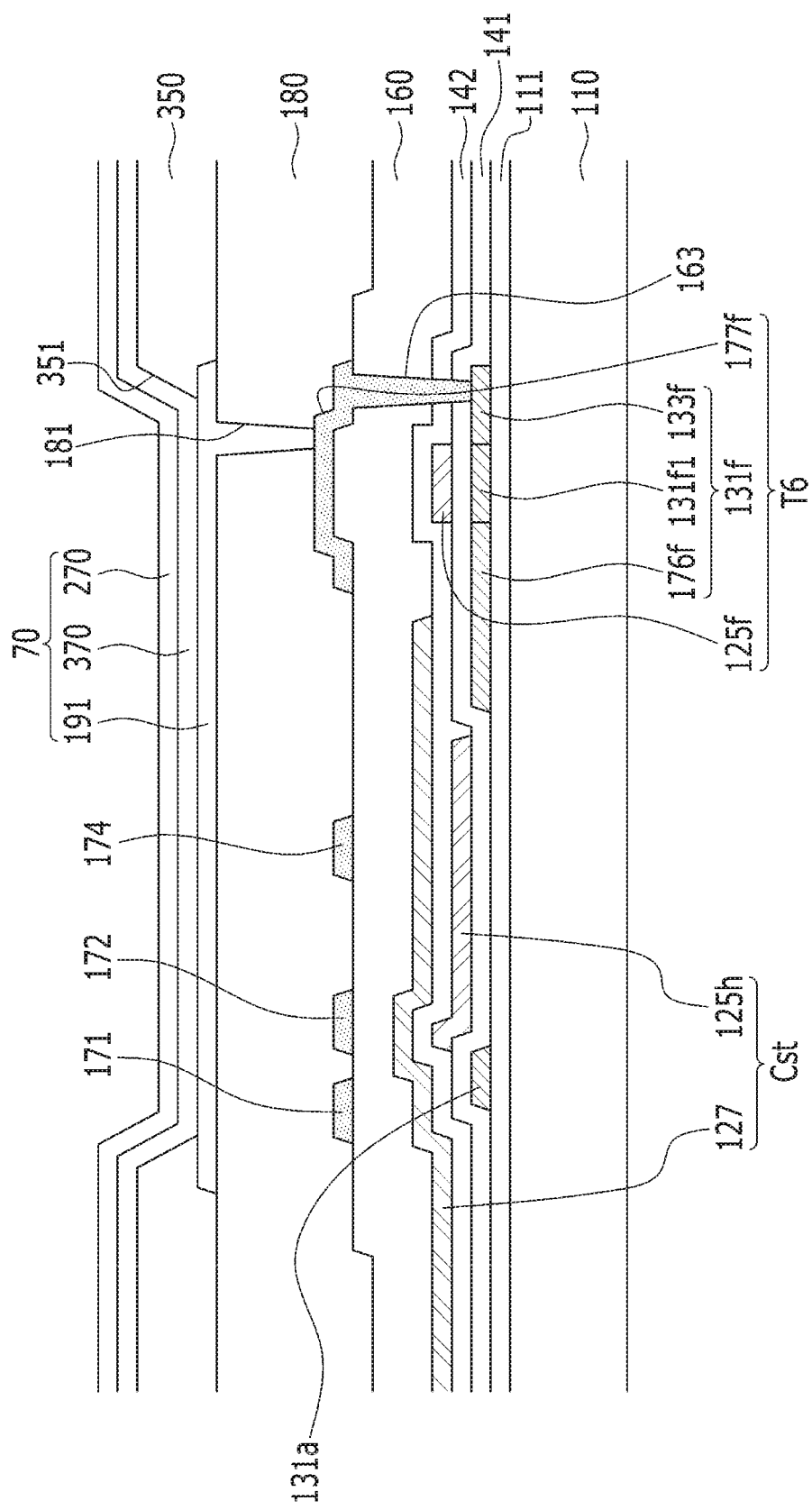
FIG. 4 is a cross-sectional view of the organic light emitting diode display of the first exemplary embodiment shown in FIG. 3, which is taken along the line IV-IV.
Figure 5:
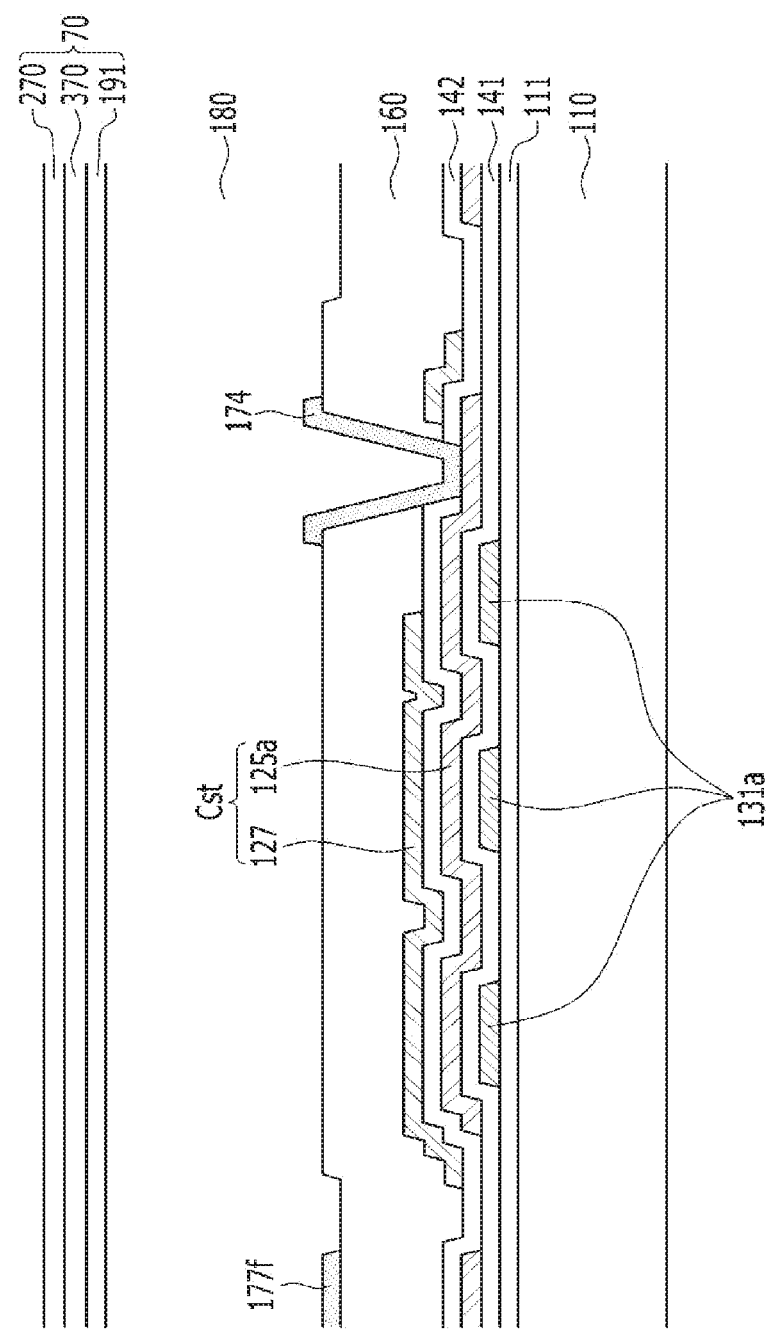
FIG. 5 is a cross-sectional view of the organic light emitting diode display of the first exemplary embodiment shown in FIG. 3, which is taken along the line V-V.

A detailed structure of the pixel of the organic light emitting diode display shown in FIG. 1 will be described in detail with reference to FIGS. 2 to 5 together with FIG. 1. FIG. 2 is a view schematically showing positions of the plurality of thin film transistors T1-T6 and the capacitor Cst elements of the organic light emitting diode display according to the first exemplary embodiment, FIG. 3 is a specific layout view of one pixel of the organic light emitting diode display according to the first exemplary embodiment, FIG. 4 is a cross-sectional view of the organic light emitting diode display of the first exemplary embodiment shown in FIG. 3, which is taken along the line IV-IV, and FIG. 5 is a cross-sectional view of the organic light emitting diode display of the first exemplary embodiment shown in FIG. 3, which is taken along the line V-V.

As shown in FIGS. 2 to 5, the pixel of the organic light emitting diode display according to the first exemplary embodiment includes the scan line 121, the prior scan line 122, the light emission control line 123, and the initialization voltage line 124 formed in a row direction, and for respectively applying the scan signal Sn, the prior scan signal Sn-1, the light emission control signal En, and the initialization voltage Vint, and also includes the data line 171 and the driving voltage line 172 crossing the scan line 121, the prior scan line 122, the light emission control line 123, and the initialization voltage line 124, and for respectively applying the data signal Dm and the driving voltage ELVDD to the pixel.

Further, in the pixel, the driving thin film transistor T1, the switching thin film transistor T2, the compensation thin film transistor T3, the initialization thin film transistor T4, the operation control thin film transistor T5, the light emission control thin film transistor T6, the storage capacitor Cst, and the OLED 70 are formed.

The driving thin film transistor T1, the switching thin film transistor T2, the compensation thin film transistor T3, the initialization thin film transistor T4, the operation control thin film transistor T5, and the light emission control thin film transistor T6 are formed along the semiconductor layer 131, and the semiconductor layer 131 is bent to have various shapes. The semiconductor layer 131 may be formed of polysilicon, and includes a channel region, which is not doped with an impurity, and a source region and a drain region formed at respective sides of the channel region to be doped with the impurity. The type of impurity corresponds to the type of thin film transistor, and an N-type impurity or a P-type impurity may be used. The semiconductor layer 131 includes a driving semiconductor layer 131a formed in the driving thin film transistor T1, a switching semiconductor layer 131b formed in the switching thin film transistor T2, a compensation semiconductor layer 131c formed in the compensation thin film transistor T3, an initialization semiconductor layer 131d formed in the initialization thin film transistor T4, an operation control semiconductor layer 131e formed in the operation control thin film transistor T5, and a light emission control semiconductor layer 131f formed in the light emission control thin film transistor T6.

The driving thin film transistor T1 includes the driving semiconductor layer 131a, the driving gate electrode 125a, the driving source electrode 176a, and the driving drain electrode 177a. The driving semiconductor layer 131a is bent, and includes a plurality of first extension portions 31 extending in a first direction, a plurality of second extension portions 32 extending in a second direction that is different from the first direction, and a plurality of bent portions 33 coupling respective ones of the first extension portions 31 and the second extension portions 32. Accordingly, the driving semiconductor layer 131a may be in a zigzag form. The driving semiconductor layer 131a shown in FIGS. 2 and 3 includes three first extension portions 31, two second extension portions 32, and four bent portions 33. Accordingly, the driving semiconductor layer 131a may be longitudinally arranged in a form (e.g., 3 substantially parallel and horizontal lines, wherein the top and center lines are coupled by a vertical line at one side, and wherein the center and bottom lines are coupled by another vertical line at an opposite side, as shown in FIG. 6).

As described above, the driving semiconductor layer 131a may be longitudinally formed in a narrow space by forming the driving semiconductor layer 131a including a plurality of bent portions 33. Accordingly, since the driving channel region 131a1 of the driving semiconductor layer 131a may be longitudinally formed, the driving range of the gate voltage applied to the driving gate electrode 125a is broadened. Therefore, since the driving range of the gate voltage is relatively broad, a gray level of light emitted from an OLED can be more finely and precisely controlled by adjusting the magnitude of the gate voltage, and as a result, it is possible to increase a resolution of the organic light emitting diode display and improve display quality.

In the driving semiconductor layer 131a, the first extension portion 31, the second extension portion 32, and the bent portion 33 may be variously located to implement various exemplary embodiments such as 'S', 'M', and 'W' (e.g., S-shaped, M-shaped, or W-shaped).

Figure 6:
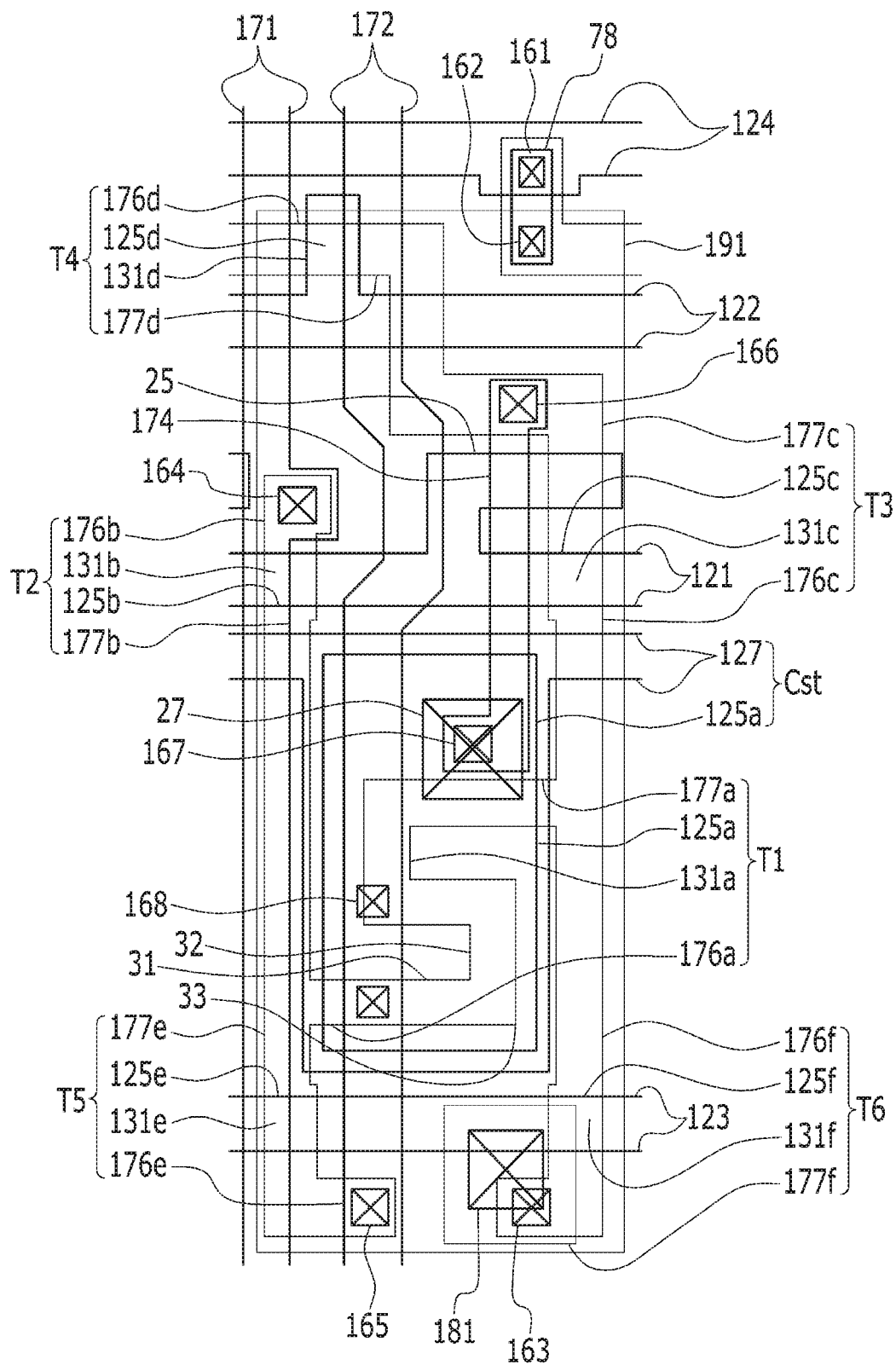
FIG. 6 is an enlarged layout view of a driving thin film transistor of an organic light emitting diode display according to a second exemplary embodiment of the present invention.

FIG. 6 is an enlarged layout view of a driving thin film transistor of an organic light emitting diode display according to a second exemplary embodiment of the present invention.

As shown in FIG. 6, the driving semiconductor layer 131a may be in the shape of an S.

The driving source electrode 176a corresponds to the driving source region 176a doped with the impurity in the driving semiconductor layer 131a, and the driving drain electrode 177a corresponds to the driving drain region 177a doped with the impurity in the driving semiconductor layer 131a. The storage capacitor Cst is formed thereon to overlap the driving gate electrode 125a.

The storage capacitor Cst includes a first storage capacitor plate 125h and a second storage capacitor plate 127 with the second gate insulating layer 142 interposed therebetween. Herein, the driving gate electrode 125a also plays a role of the first storage capacitor plate 125h, the second gate insulating layer 142 becomes a dielectric material, and storage capacitance is determined by the charge accumulated in the storage capacitor Cst, and by the voltage between both capacitor plates 125a and 127.

The first storage capacitor plate 125h is separated from the adjacent pixel to form a rectangle, and is formed of the same material as the scan line 121, the prior scan line 122, the light emission control line 123, the switching gate electrode 125b, the compensation gate electrode 125c, the operation control gate electrode 125e, and the light emission control gate electrode 125f, which are on the same layer first storage capacitor plate 125h.

The second storage capacitor plate 127 is coupled to the adjacent pixel, and is formed of the same material as the initialization voltage line 124, and is formed on the same layer as the initialization voltage line 124.

As described above, it is possible to ensure sufficient storage capacitance even at a high resolution by forming the storage capacitor Cst overlapping the driving semiconductor layer 131a to ensure a region of the storage capacitor Cst, which is reduced by the driving semiconductor layer 131a having the bent portion.

The switching thin film transistor T2 includes the switching semiconductor layer 131b, the switching gate electrode 125b, the switching source electrode 176b, and the switching drain electrode 177b. The switching source electrode 176b is a portion protruding from the data line 171, and the switching drain electrode 177b corresponds to a switching drain region 177b doped with an impurity in the switching semiconductor layer 131b.

The compensation thin film transistor T3 includes the compensation semiconductor layer 131c, the compensation gate electrode 125c, the compensation source electrode 176c, and the compensation drain electrode 177c. The compensation source electrode 176c corresponds to the compensation source region 176c doped with the impurity in the compensation semiconductor layer 131c, and the compensation drain electrode 177c corresponds to the compensation drain region 177c doped with the impurity in the compensation semiconductor layer 131c. The compensation gate electrode 125c prevents a leakage current by forming a separate dual gate electrode 25.

The initialization thin film transistor T4 includes the initialization semiconductor layer 131d, the initialization gate electrode 125d, the initialization source electrode 176d, and the initialization drain electrode 177d. The initialization drain electrode 177d corresponds to the initialization drain region 177d doped with the impurity in the initialization semiconductor layer 131d. The initialization source electrode 176d is coupled through an initialization connection line 78 to the initialization voltage line 124. An end of the initialization connection line 78 is coupled through a contact hole 161 formed in the second gate insulating layer 142 and an interlayer insulating layer 160 to the initialization voltage line 124, and another end of the initialization connection line 78 is coupled through the contact hole 162 formed in the gate insulating layer 141, the second gate insulating layer 142, and the interlayer insulating layer 160 to the initialization source electrode 176d.

The operation control thin film transistor T5 includes the operation control semiconductor layer 131e, the operation control gate electrode 125e, the operation control source electrode 176e, and the operation control drain electrode 177e. The operation control source electrode 176e is a portion of the driving voltage line 172, and the operation control drain electrode 177e corresponds to the operation control drain region 177e doped with the impurity in the operation control semiconductor layer 131e.

The light emission control thin film transistor T6 includes the light emission control semiconductor layer 131f, the light emission control gate electrode 125f, the light emission control source electrode 176f, and the light emission control drain electrode 177f. The light emission control source electrode 176f corresponds to the light emission control source region 176f doped with the impurity in the light emission control semiconductor layer 131f.

An end of the driving semiconductor layer 131a of the driving thin film transistor T1 is coupled to the switching semiconductor layer 131b and the compensation semiconductor layer 131c, and another end of the driving semiconductor layer 131a is coupled to the operation control semiconductor layer 131e and the light emission control semiconductor layer 131f. Therefore, the driving source electrode 176a is coupled to the switching drain electrode 177b and to the operation control drain electrode 177e, and the driving drain electrode 177a is coupled to the compensation source electrode 176c and to the light emission control source electrode 176f.

The first storage capacitor plate 125h of the storage capacitor Cst is coupled through the connection member 174 to the compensation drain electrode 177c and to the initialization drain electrode 177d. The connection member 174 is formed on the same layer as the data line 171, an end of the connection member 174 is coupled through a contact hole 166 formed in the first gate insulating layer 141, in the second gate insulating layer 142, and in the interlayer insulating layer 160 to the compensation drain electrode 177c and to the initialization drain electrode 177d, and another end of the connection member 174 is coupled through a contact hole 167 formed in the second gate insulating layer 142 and in the interlayer insulating layer 160 to the first storage capacitor plate 125h. In this case, another end of the connection member 174 is coupled through a storage opening 27 formed in the second storage capacitor plate 127 to the first storage capacitor plate 125h.

The second storage capacitor plate 127 of the storage capacitor Cst is coupled through a contact hole 168 formed in the interlayer insulating layer 160 to a driving voltage line 172.

The switching thin film transistor T2 is used as a switching element for selecting the pixel that is to emit light. The switching gate electrode 125b is coupled to the scan line 121, the switching source electrode 176b is coupled to the data line 171, and the switching drain electrode 177b is coupled to the driving thin film transistor T1 and to the operation control thin film transistor T5. In addition, the light emission control drain electrode 177f of the light emission control thin film transistor T6 is directly coupled through a contact hole 181 formed in the protective layer 180 to a pixel electrode 191 of an organic light emitting diode 70.

Hereinafter, referring to FIGS. 4 and 5, a structure of the organic light emitting diode display according to the first exemplary embodiment will be described in detail according to the lamination order.

The structure of the thin film transistor will be described based on the driving thin film transistor T1, the switching thin film transistor T2, and the light emission control thin film transistor T6. In addition, the laminate structures of the film transistors T3, T4, and T5 are almost the same as the laminate structures of the driving thin film transistor T1, the switching thin film transistor T2, and the light emission control thin film transistor T6, and thus, the remaining thin film transistors T3, T4, and T5 are not described in further detail.

A buffer layer 111 is formed on the substrate 110, and the substrate 110 may be formed of an insulating substrate made of glass, quartz, ceramics, plastics or the like.

The driving semiconductor layer 131a, the switching semiconductor layer 131b, and the light emission control semiconductor layer 131f are formed on the buffer layer 111. The driving semiconductor layer 131a includes a driving source region 176a and a driving drain region 177a facing each other with a driving channel region 131a1 interposed therebetween, the switching semiconductor layer 131b includes a switching source region 132b and a switching drain region 177b facing each other with a switching channel region 131b1 interposed therebetween, and the light emission control thin film transistor T6 includes a light emission control channel region 131f1, the light emission control source region 176f, and the light emission control drain region 133f.

Since the driving semiconductor layer 131a includes a plurality of bent portions 33 to be formed in a zigzag form, specifically, in a '⊇' form, the driving semiconductor layer 131a may be longitudinally formed in a narrow space. Accordingly, since the driving channel region 131a1 of the driving semiconductor layer 131a may be longitudinally formed, the driving range of the gate voltage applied to the driving gate electrode 125a may be broadened.

The first gate insulating layer 141 formed of silicon nitride (SiNx) or silicon oxide (SiO2) is formed on the switching semiconductor layer 131a, the driving semiconductor layer 131b, and the light emission control semiconductor layer 131f.

The first gate wires including the scan line 121, which includes the driving gate electrode 125a, the switching gate electrode 125b, and the compensation gate electrode 125c, the prior scan line 122, which includes the initialization gate electrode 125d, and the light emission control line 123, which includes the operation control gate electrode 125e and the light emission control gate electrode 125f, are formed on the first gate insulating layer 141.

The driving gate electrode 125a is separated from the scan line 121, and the floating gate electrode 25 overlaps the driving channel region 131a1 of the driving semiconductor layer 131a. In addition, the switching gate electrode 125b is coupled to the scan line 121, and the switching gate electrode 125b overlaps the switching channel region 131b1 of the switching semiconductor layer 131b. In addition, the light emission control gate electrode 125f overlaps the light emission control channel region 131f1 of the light emission control semiconductor layer 131f.

Because, in the switching thin film transistor T2, only the first gate insulating layer 141 is formed between the switching gate electrode 125b and the switching semiconductor layer 131b, it is possible to perform a relatively rapid switching operation, and in the driving thin film transistor T1, only the first gate insulating layer 141 is formed between the driving gate electrode 125a and the driving semiconductor layer 131a, but since the length of the driving channel region 131a1 of the driving semiconductor layer 131a is relatively large, the driving range of the gate voltage applied to the driving gate electrode 125a is relatively broadened, such that it is possible to more finely, or precisely, control the gray level of light emitted from the OLED.

The first gate wires 125a, 125b, 125c, 125d, 125e, 125f, 121, 122, and 123 and the first gate insulating layer 141 cover the second gate insulating layer 142. The second gate insulating layer 142 may be formed of silicon nitride (SiNx) or silicon oxide (SiO2).

Second gate wires including the second storage capacitor plate 127 and the initialization voltage line 124 are formed on the second gate insulating layer 142. The second storage capacitor plate 127 overlaps the first storage capacitor plate 125h to form the storage capacitor Cst, and the first storage capacitor plate 125h overlaps the driving semiconductor layer 131a. As described above, it is possible to ensure the storage capacitance, even at a high resolution wherein the size of the pixel is reduced, by ensuring a region of the storage capacitor Cst reduced by the driving semiconductor layer 131a having the bent portion 33 by forming the storage capacitor Cst overlapping the driving semiconductor layer 131a.

The interlayer insulating layer 160 is formed on the second gate insulating layer 142, on the second storage capacitor plate 127, and on the initialization voltage line 124. The first gate insulating layer 141, the second gate insulating layer 142, and the interlayer insulating layer 160 together have a contact hole 163 through which the light emission control drain region 133f of the light emission control semiconductor layer 131f is exposed. Like the first gate insulating layer 141 and the second gate insulating layer 142, the interlayer insulating layer 160 may be made of a ceramic-based material such as silicon nitride (SiNx) or silicon oxide (SiO2).

Data wires including the data line 171, the switching source electrode 176b, the driving voltage line 172, the connection member 174, and the light emission control drain electrode 177f, are formed on the interlayer insulating layer 160.

In addition, the switching source electrode 176b and the light emission control drain electrode 177f are coupled through the contact holes 164 and 163 formed in the interlayer insulating layer 160, in the first gate insulating layer 141, and in the second gate insulating layer 142 to the switching source region 132b of the switching semiconductor layer 131b and to the light emission control drain region 133f of the light emission control semiconductor layer 131f, respectively.

The protective layer 180, which covers the data wires 171, 172, 174, and 177f, is formed on the interlayer insulating layer 160, and the pixel electrode 191 is formed on the protective layer 180. The pixel electrode 191 is coupled through the contact hole 181 formed in the protective layer 180 to the light emission control drain electrode 177f.

A barrier rib 350 is formed on an edge of the pixel electrode 191 and the protective layer 180, and the barrier rib 350 has a barrier rib opening 351 through which the pixel electrode 191 is exposed. The barrier rib 350 may be made of, for example, resins such as polyacrylates and polyimides or silica-based inorganic materials.

An organic emission layer 370 is formed on the pixel electrode 191 exposed through the barrier rib opening 351, and the common electrode 270 is formed on the organic emission layer 370. As described above, the organic light emitting diode 70 including the pixel electrode 191, the organic emission layer 370, and the common electrode 270 is formed.

Herein, the pixel electrode 191 is an anode that is a hole injection electrode, and the common electrode 270 is a cathode that is an electron injection electrode. However, the present invention is not limited thereto, and the pixel electrode 191 may be the cathode, and the common electrode 270 may be the anode, according to the driving method of the organic light emitting diode display. Holes and electrons are respectively injected from the pixel electrode 191 and the common electrode 270 into the organic emission layer 370, and when the exciton, which results from the combined injected holes and electrons, falls from an excited state to a bottom state, light is emitted.

The organic emission layer 370 may be formed of a low molecular weight organic material, or a high molecular weight organic material such as, for example, PEDOT (poly 3,4-ethylenedioxythiophene). Further, the organic emission layer 370 may be formed of a multilayer structure including one or more of an emission layer, a hole injection layer HIL, a hole transport layer HTL, an electron transport layer ETL, and an electron injection layer EIL. In the case where all the layers are included, the hole injection layer HIL is located on the pixel electrode 710, which is the anode, and the hole transport layer HTL, the emission layer, the electron transport layer ETL, and the electron injection layer EIL are sequentially laminated thereon. Since the common electrode 270 is formed of a reflective conductive material, a rear surface light emission-type organic light emitting diode display is realized. Material such as lithium (Li), calcium (Ca), lithium fluoride/calcium (LiF/Ca), lithium fluoride/aluminum (LiF/Al), aluminum (Al), silver (Ag), magnesium (Mg), or gold (Au) may be used as the reflective material.

In the first exemplary embodiment, the first storage capacitor plate 125h has a rectangular shape. However, a third exemplary embodiment of the present invention enables increased storage capacitance by extending a portion of the first storage capacitor plate 125h.

Figure 7:
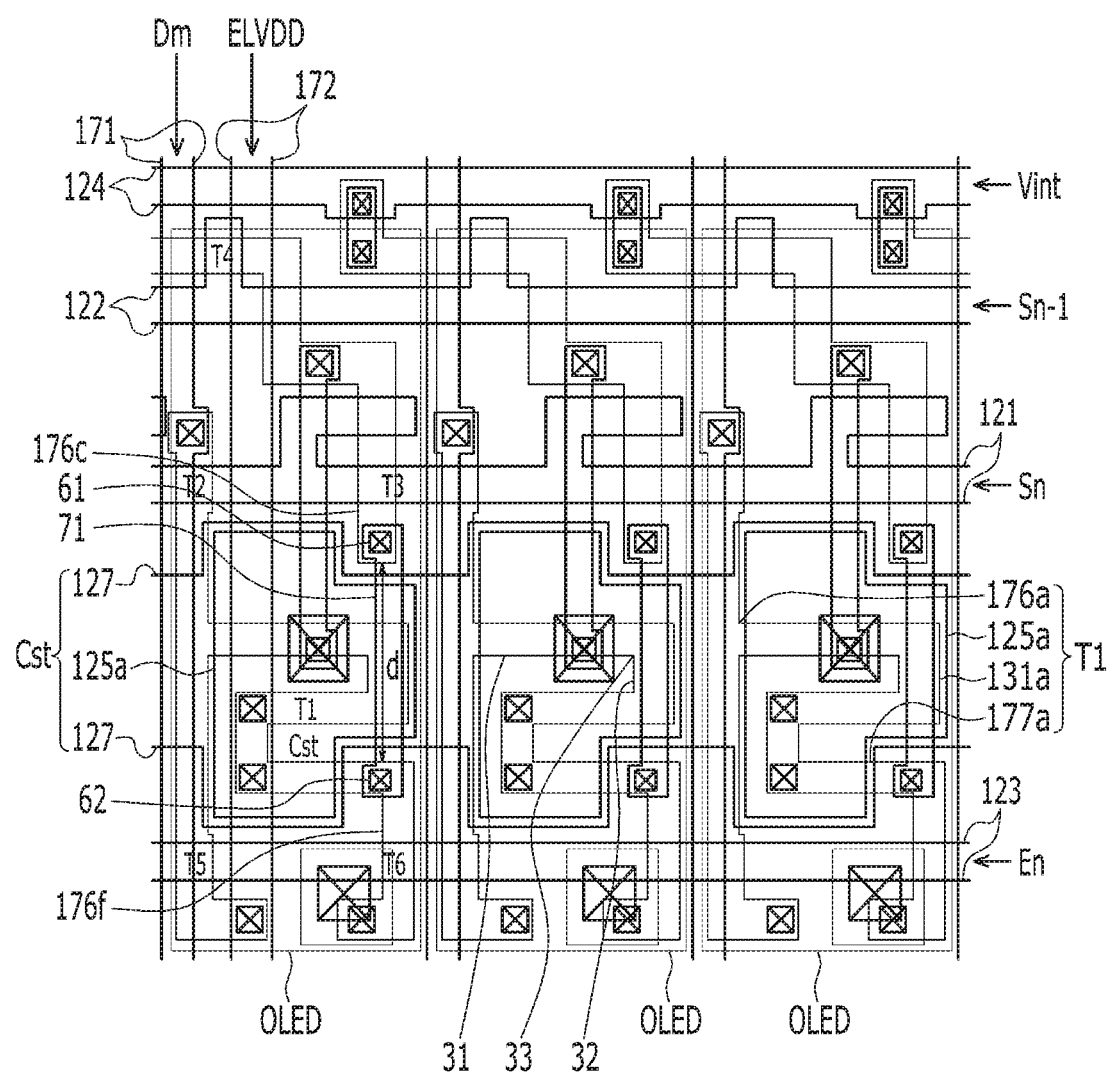
FIG. 7 is a layout view of an organic light emitting diode display according to a third exemplary embodiment of the present invention.

Referring now to FIG. 7, an organic light emitting diode display according to the third exemplary embodiment of the present invention will be described in detail, wherein FIG. 7 is a layout view of an organic light emitting diode display according to a third exemplary embodiment.

The third exemplary embodiment of the present invention is substantially the same as the first exemplary embodiment shown in FIGS. 1 to 5, with the exception of the driving semiconductor layer and the storage capacitor, and thus a repeated description of the similar features will be omitted.

As shown in FIG. 7, the driving thin film transistor T1 of the organic light emitting diode display according to the third exemplary embodiment includes the driving semiconductor layer 131a, the driving gate electrode 125a, the driving source electrode 176a, and the driving drain electrode 177a. The driving semiconductor layer 131a is bent, and includes a plurality of first extension portions 31 extending in a first direction, a plurality of second extension portions 32 extending in a second direction that is different from the first direction, and a plurality of bent portions 33 coupling respective ones of the first extension portions 31 and the second extension portions 32.

The driving semiconductor layer 131a may extend from a lateral surface of the data line 171 to be adjacent to the data line 171. Accordingly, since the length of the driving semiconductor layer 131a is increased, the driving range of the gate voltage applied to the driving gate electrode 125a may be broadened.

In the third exemplary embodiment, the compensation source electrode 176c of the compensation thin film transistor T3, and the light emission control source electrode 176f of the light emission control thin film transistor T6, are formed on the same layer, but the compensation source electrode 176c and the light emission control source electrode 176f are separated from each other with a spacing portion d therebetween so as to not overlap the driving semiconductor layer 131a.

The driving gate electrode 125a, that is, the first storage capacitor plate 125h may extend in a lateral direction to overlap the extended driving semiconductor layer 131a, and the first storage capacitor plate 125h may partially overlap the spacing portion d. In addition, the second storage capacitor plate 127 extends so as to overlap the first storage capacitor plate 125h, and the second storage capacitor plate 127 partially overlaps the spacing portion d.

The compensation source electrode 176c and the light emission control source electrode 176f, which are partially separated from each other, are coupled to each other through the transistor connection portion 71 formed on the same layer as the data line 171. An end of the transistor connection portion 71 is coupled through a contact hole 61 formed in the first gate insulating layer 141, in the second gate insulating layer 142, and in the interlayer insulating layer 160, to the compensation source electrode 176c. Another end of the transistor connection portion 71 is coupled through a contact hole 62 formed in the first gate insulating layer 141, in the second gate insulating layer 142, and in the interlayer insulating layer 160, to the light emission control source electrode 176f. Accordingly, the storage capacitor Cst extends to overlap the transistor connection portion 71, and the driving semiconductor layer 131a extends to overlap the transistor connection portion 71.

As described above, since the compensation source electrode 176c and the light emission control source electrode 176f may be coupled through the transistor connection portion 71 to allow the driving semiconductor layer 131a, the first storage capacitor plate 125h, and the second storage capacitor plate 127 to extend to the spacing portion d between the compensation source electrode 176c and the light emission control source electrode 176f, the storage capacitor Cst may be further extended.

In the first exemplary embodiment, the driving semiconductor layer 131a is not directly coupled to the compensation source electrode 176c at the bent portion 33. However, in a fourth exemplary embodiment of the present invention, a branched portion 34 is directly branched from the compensation source electrode 176c at the bent portion 33.

Figure 8:
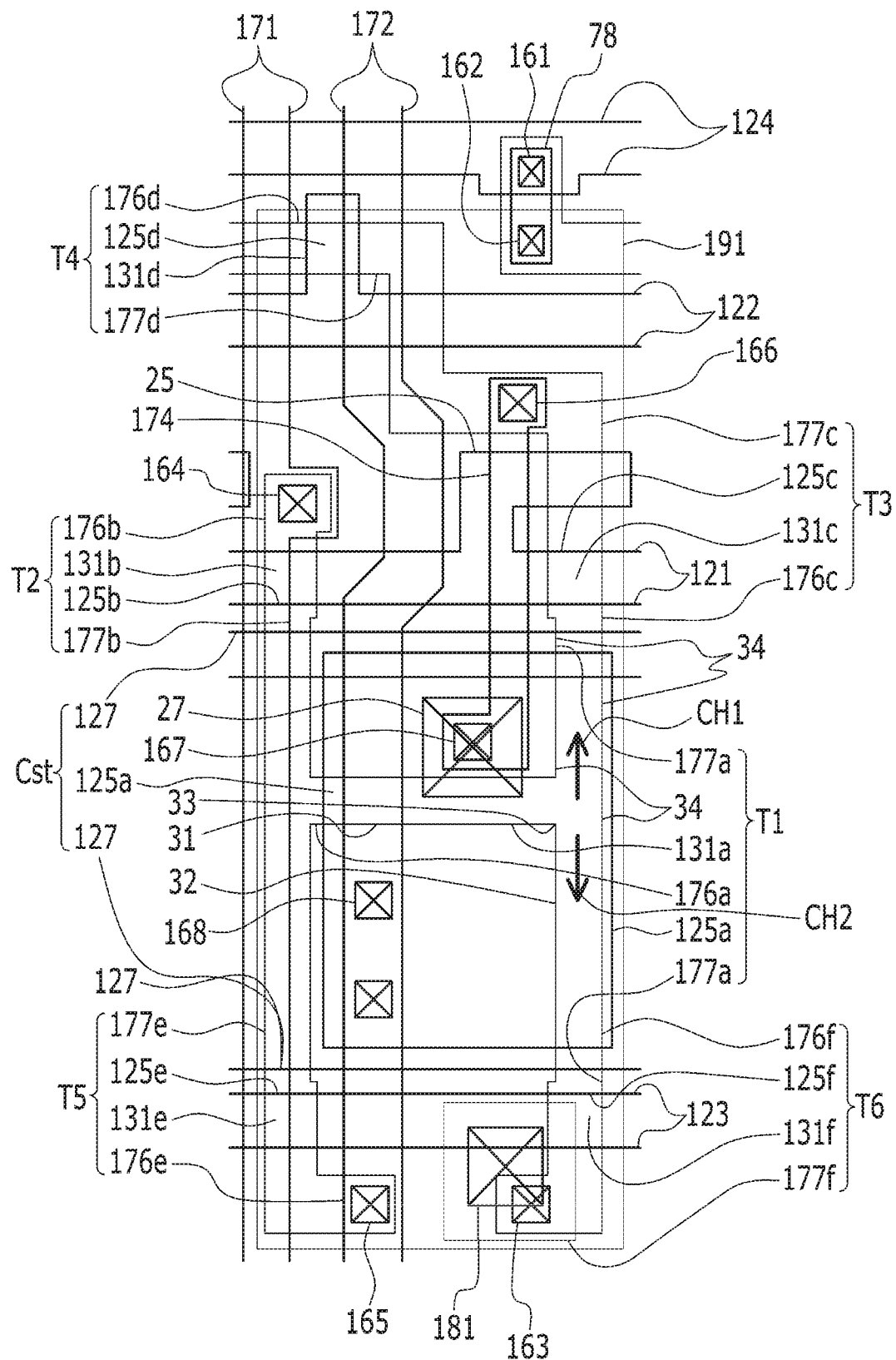
FIG. 8 is an enlarged layout view of a driving thin film transistor of an organic light emitting diode display according to a fourth exemplary embodiment of the present invention.

Now referring to FIG. 8, an organic light emitting diode display according to the fourth exemplary embodiment will be described in detail. FIG. 8 is an enlarged layout view of a driving thin film transistor of an organic light emitting diode display according to the fourth exemplary embodiment. The fourth exemplary embodiment is substantially the same as the first exemplary embodiment shown in FIGS. 1 to 5, with the exception of the driving semiconductor layer and the storage capacitor, and thus, repeated description of the substantially similar features will be omitted.

As shown in FIG. 8, the driving thin film transistor T1 of the organic light emitting diode display according to the fourth exemplary embodiment includes the driving semiconductor layer 131a, the driving gate electrode 125a, the driving source electrode 176a, and the driving drain electrode 177a. The driving semiconductor layer 131a is bent, and includes the first extension portion 31 extending in a first direction, the second extension portion 32 extending in a second direction that is different from the first direction, the bent portion 33 coupling the first extension portion 31 and the second extension portion 32, and the branched portion 34 directly branched to the compensation source electrode 176c at the bent portion 33. The entire driving semiconductor layer 131a has a ' ' form (e.g., a vertical line having a horizontal line extending from near a center of the vertical line). Accordingly, since the length of the driving semiconductor layer 131a is increased, the driving range of the gate voltage applied to the driving gate electrode 125a may be broadened.

The branched portion 34 corresponds to a first path semiconductor layer CH1 coupled to the compensation thin film transistor T3, and the second extension portion 32 corresponds to a second path semiconductor layer CH2 coupled to the light emission control thin film transistor T6. In addition, the driving gate electrode 125a, that is, the first storage capacitor plate 125h, overlaps the first path semiconductor layer CH1 and the second path semiconductor layer CH2 of the driving semiconductor layer 131a, and the second storage capacitor plate 127 overlaps the first storage capacitor plate 125h. Accordingly, since the area of the storage capacitor Cst is increased, sufficient storage capacitance can be attained even at a high resolution.

In the fourth exemplary embodiment, the lengths of the first path semiconductor layer CH1 and the second path semiconductor layer CH2 are substantially the same as each other. However, in a fifth exemplary embodiment of the present invention, the lengths of the first path semiconductor layer CH1 and the second path semiconductor layer CH2 are different from each other.

Figure 9:
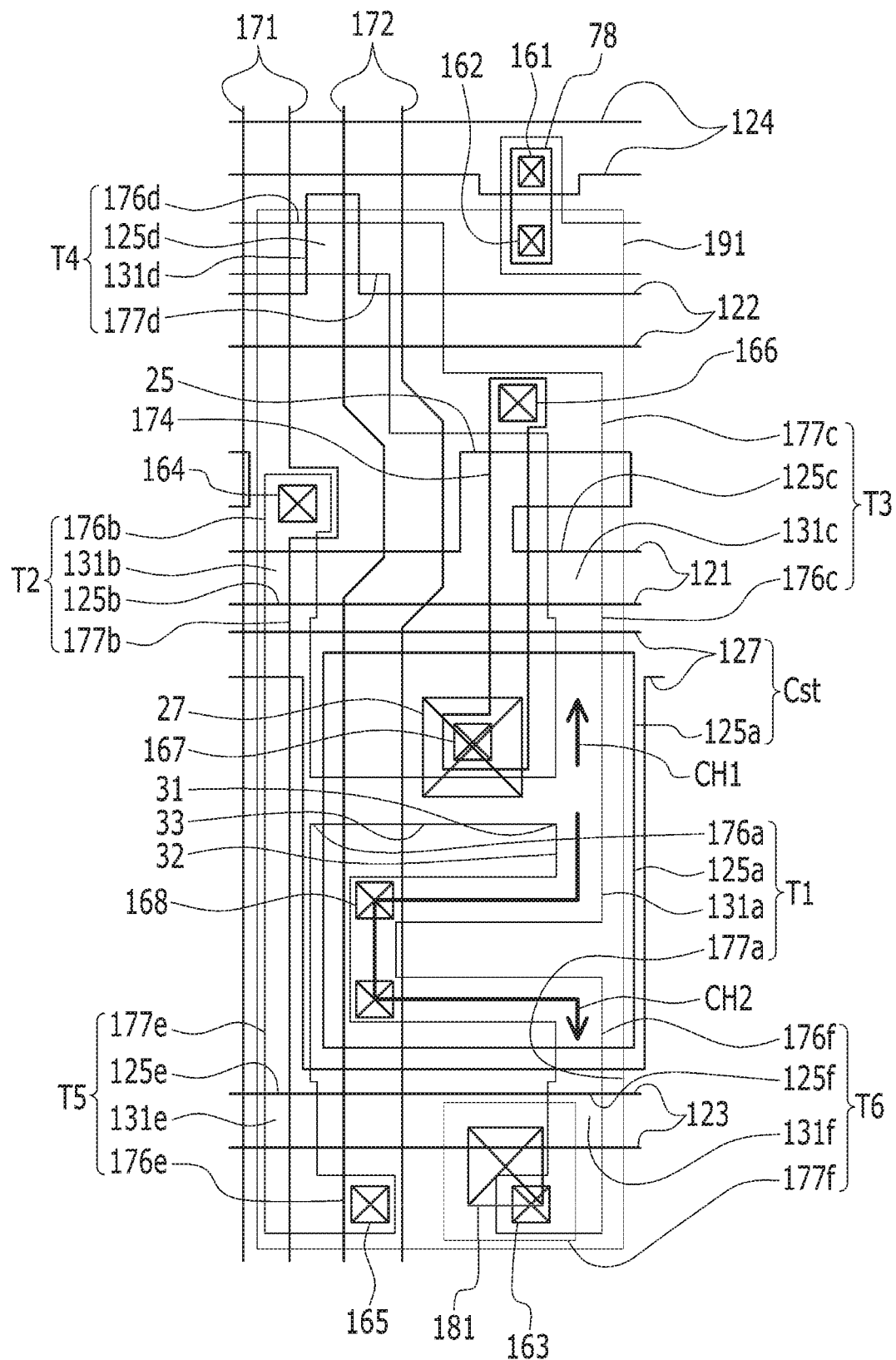
FIG. 9 is an enlarged layout view of a driving thin film transistor of an organic light emitting diode display according to a fifth exemplary embodiment of the present invention.

Referring now to FIG. 9, an organic light emitting diode display according to the fifth exemplary embodiment of the present embodiment will be described in detail. FIG. 9 is an enlarged layout view of a driving thin film transistor of an organic light emitting diode display according to the fifth exemplary embodiment, which is substantially the same as the fourth exemplary embodiment shown in FIG. 8, with the exception of the driving semiconductor layer and the storage capacitor, and thus a repeated description of the similarities will be omitted.

As shown in FIG. 9, the driving thin film transistor T1 of the organic light emitting diode display according to the fifth exemplary embodiment includes the driving semiconductor layer 131a, the driving gate electrode 125a, the driving source electrode 176a, and the driving drain electrode 177a. The driving semiconductor layer 131a is bent. The driving semiconductor layer 131a includes the first extension portion 31 extending in a first direction, the second extension portion 32 extending in a second direction that is different from the first direction, the bent portion 33 coupling the first extension portion 31 and the second extension portion 32, and the branched portion 34 directly branched from the compensation source electrode 176c at the bent portion 33. Accordingly, since the length of the driving semiconductor layer 131a is increased, the driving range of the gate voltage applied to the driving gate electrode 125a may be broadened.

The branched portion 34 corresponds to the first path semiconductor layer CH1 coupled to the compensation thin film transistor T3, and a zigzag portion 30, which includes the first extension portion 31, the second extension portion 32, and the bent portion 33, corresponds to the second path semiconductor layer CH2 coupled to the light emission control thin film transistor T6. In addition, the driving gate electrode 125a, that is, the first storage capacitor plate 125h, overlaps the first path semiconductor layer CH1 and the second path semiconductor layer CH2 of the driving semiconductor layer 131a, and the second storage capacitor plate 127 overlaps the first storage capacitor plate 125h. Accordingly, since the area of the storage capacitor Cst is increased, sufficient storage capacitance can be ensured even at a high resolution.

Further, the length of the first path semiconductor layer CH1 is smaller than the length of the second path semiconductor layer CH2. This structure is called a short pass diode structure, and since the length of the first path semiconductor layer CH1 is different from the length of the second path semiconductor layer CH2, currents having different magnitudes may concurrently (e.g., simultaneously) flow. Since the length of the first path semiconductor layer CH1 is relatively small, a relatively large current may flow therein, and since the length of the second path semiconductor layer CH2 is relatively large, relatively small currents may flow therein (e.g., at a same time as the relatively large current in the first path semiconductor layer CH1). As described above, a constant current may be provided to the organic light emitting diode while a threshold voltage is rapidly compensated by using a characteristic of concurrently (e.g., simultaneously) providing currents having different magnitudes by one driving thin film transistor to reduce a current variation between the driving thin film transistors having different characteristics, thus preventing stains caused by a difference between magnitudes of the currents, and the driving operation thereof will be described in detail below.

The driving thin film transistor T1 charges the voltage corresponding to the data signal Dm in the storage capacitor Cst according to the scan signal Sn, and provides the current corresponding to the voltage charged in the storage capacitor Cst to the OLED. Because the threshold voltage Vth of the driving thin film transistor T1 may be changed over time, the compensation thin film transistor T3 performs diode-connection of the driving thin film transistor T1 according to the scan signal Sn to compensate the threshold voltage Vth of the driving thin film transistor T1.

Accordingly, since the relatively large current flowing through the first path semiconductor layer CH1 while the data signal Dm is transferred can rapidly charge the storage capacitor Cst through the compensation thin film transistor T3 (e.g., to a predetermined voltage/compensation voltage), the compensation of the threshold voltage Vth may be relatively rapidly and easily performed.

Further, the relatively small current flowing through the second path semiconductor layer CH2 is provided through the light emission control thin film transistor T6 to the OLED, stains may be avoided or prevented. That is, since a change in current according to a change in voltage applied to the driving gate electrode 125a of the driving thin film transistor T1 is small, a current control voltage width (data swing range) can be increased, such that the range of the data voltage displaying a gamma can be increased, and it is possible to avoid or prevent stains caused by a difference between magnitudes of the currents by reducing a current variation between the driving thin film transistors having different characteristics (e.g., distribution characteristics).

Since a known driving thin film transistor can allow only a current of one magnitude to flow through the driving semiconductor layer 131a, currents having the same magnitude are provided to the compensation thin film transistor T3 and the light emission control thin film transistor T6. Accordingly, when the length of the driving semiconductor layer 131a of the driving thin film transistor T1 is relatively small, so that the threshold voltage Vth of the driving thin film transistor T1 is rapidly compensated, because an s-factor of a transistor characteristic curve (transfer curve) is reduced, thereby increasing a ratio (e.g., change ratio) of a change in current to a change in voltage applied to the driving gate electrode, thereby causing a relatively large current to be provided to the OLED, potentially causing stains.

Conversely, when the length of the driving semiconductor layer 131a of the driving thin film transistor T1 is set to be relatively large in an attempt to avoid or prevent stains, because the threshold voltage Vth of the driving thin film transistor is compensated by the small current relatively slowly, low gray level compensation is not performed, causing stains. This problem becomes more noticeable as the resolution is increased. That is, because an amount of time during which the data signal Dm is applied is reduced as the resolution is increased, the current flows to the OLED before the threshold voltage Vth is completely compensated, causing the current variation to generate stains.

Accordingly, it is possible to avoid or prevent low gray level stains by setting the length of the first path semiconductor layer CH1 coupled to the compensation thin film transistor T3 to be smaller than the length of the second path semiconductor layer CH2 coupled to the light emission control thin film transistor T6.

The first exemplary embodiment has a structure where the driving semiconductor layer of the driving thin film transistor is bent in a "6tr 1cap" structure, which is formed of six thin film transistors and one storage capacitor. However, a sixth exemplary embodiment of the present embodiment has a structure where the driving semiconductor layer of the driving thin film transistor is bent in a "7tr 1cap" structure formed of seven thin film transistors and one storage capacitor.

Figure 10:
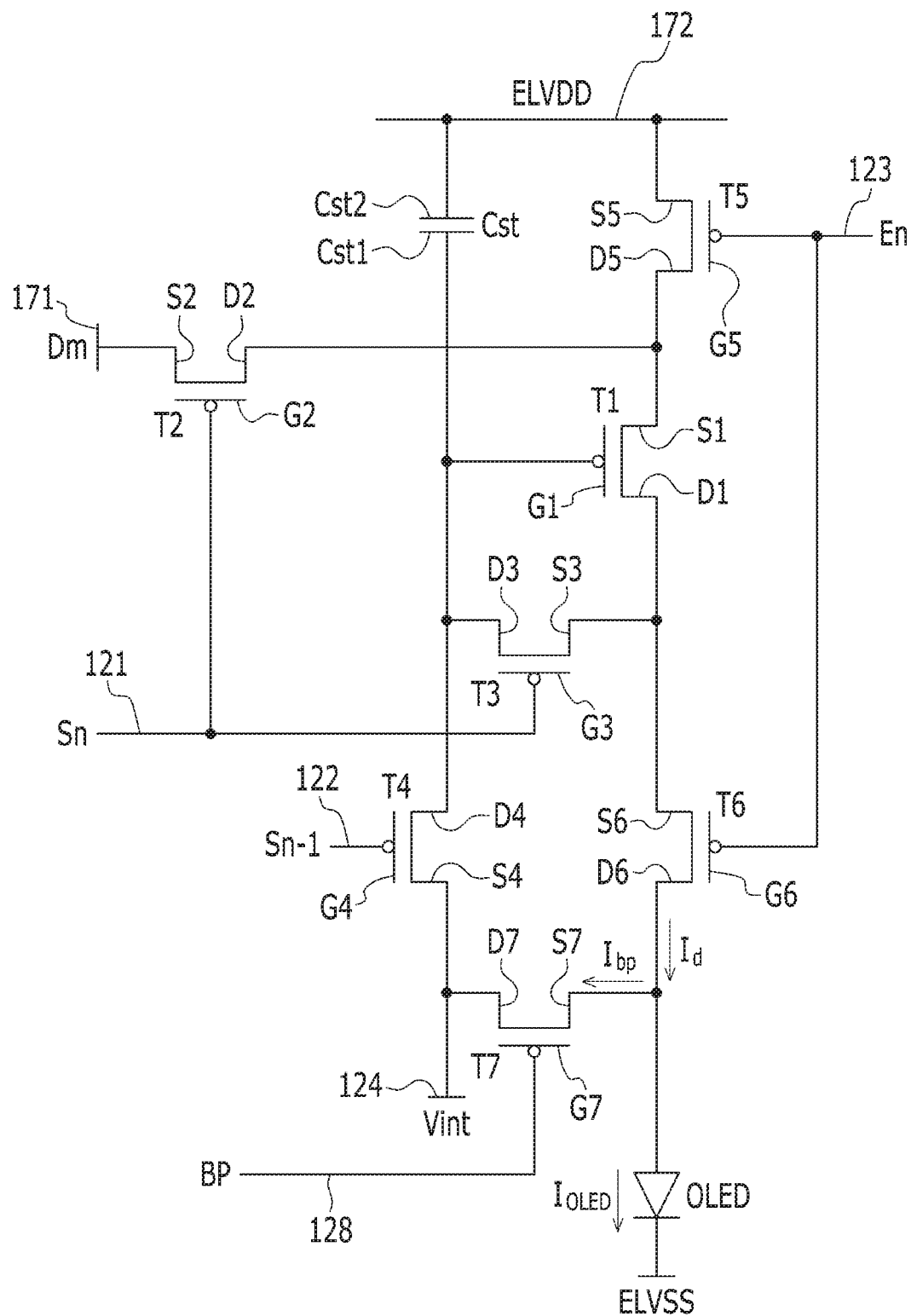
FIG. 10 is an equivalent circuit of one pixel of an organic light emitting diode display according to a sixth exemplary embodiment of the present invention.
Figure 11:
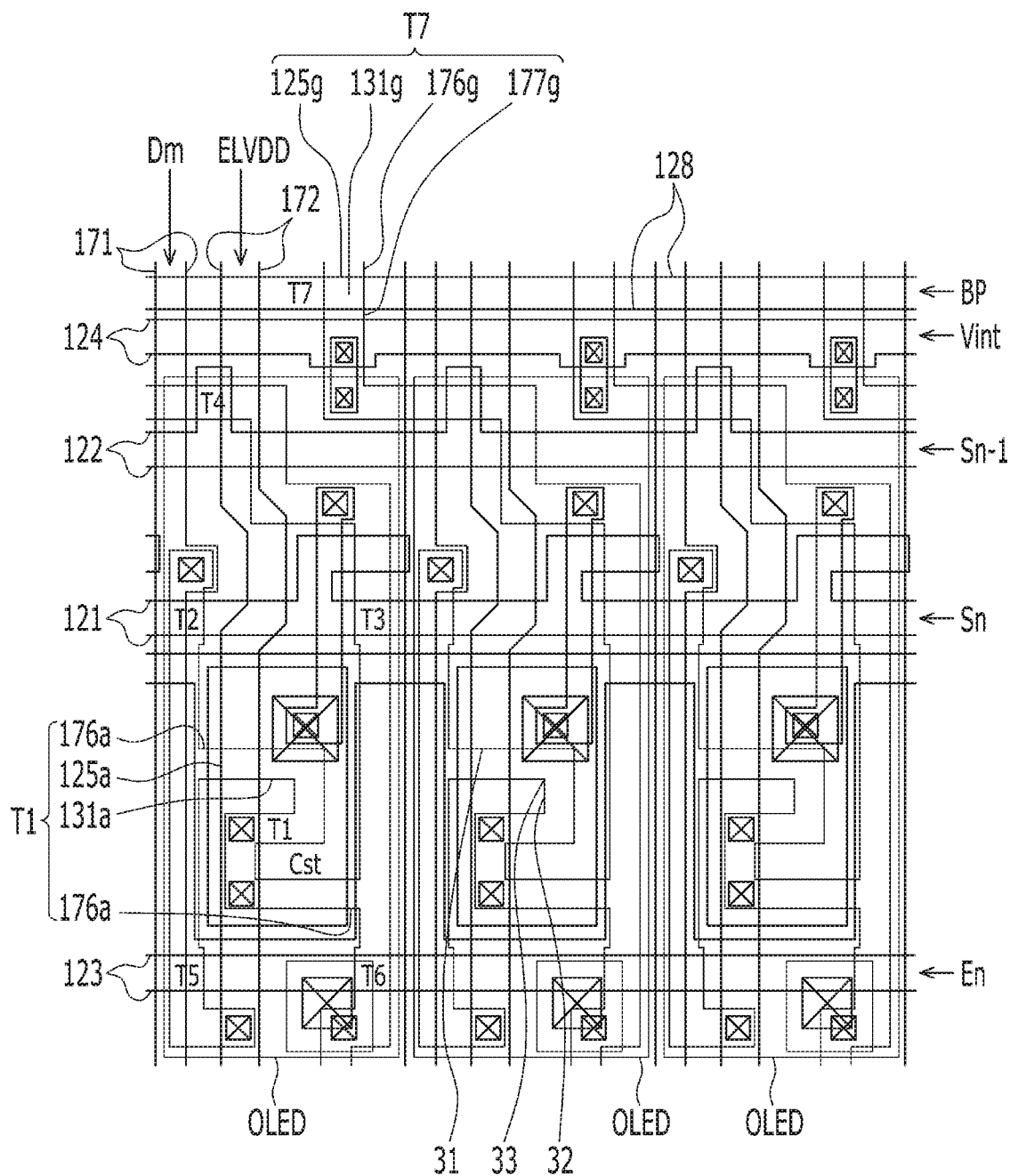
FIG. 11 is a layout view of the organic light emitting diode display according to the sixth exemplary embodiment.

Referring now to FIGS. 10 and 11, an organic light emitting diode display according to the sixth exemplary embodiment will be described in detail. FIG. 10 is an equivalent circuit of one pixel of an organic light emitting diode display according to the sixth exemplary embodiment, and FIG. 11 is a layout view of the organic light emitting diode display according to the sixth exemplary embodiment, which is substantially the same as the first exemplary embodiment shown in FIGS. 1 to 5, except that a current control thin film transistor is added, and thus a repeated description of similarities will be omitted.

As shown in FIGS. 10 and 11, one pixel of the organic light emitting diode display according to the sixth exemplary embodiment includes a plurality of signal lines 121, 122, 123, 124, 128, 171, and 172, and a plurality of thin film transistors T1, T2, T3, T4, T5, T6, and T7, the storage capacitor Cst, and the OLED coupled to a plurality of signal lines.

The plurality of thin film transistors includes the driving thin film transistor T1, the switching thin film transistor T2, the compensation thin film transistor T3, the initialization thin film transistor T4, the operation control thin film transistor T5, the light emission control thin film transistor T6, and the current control thin film transistor T7.

The signal line includes the scan line 121 for transferring the scan signal Sn, the prior scan line 122 for transferring the prior scan signal Sn-1 to the initialization thin film transistor T4, the light emission control line 123 for transferring light emission control signal En to the operation control thin film transistor T5 and to the light emission control thin film transistor T6, the data line 171 crossing the scan line 121 and for transferring the data signal Dm, the driving voltage line 172, which is substantially parallel to the data line 171, for transferring the driving voltage ELVDD, the initialization voltage line 124 for transferring the initialization voltage Vint for initializing the driving thin film transistor T1, and a bypass control line 128 for transferring a bypass signal BP to a bypass thin film transistor T7.

The gate electrode G1 of the driving thin film transistor T1 is coupled to an end (e.g., a first end) Cst1 of the storage capacitor Cst, the source electrode S1 of the driving thin film transistor T1 is coupled via the operation control thin film transistor T5 to the driving voltage line 172, the drain electrode D1 of the driving thin film transistor T1 is electrically coupled via the light emission control thin film transistor T6 to an anode of the OLED.

The gate electrode G2 of the switching thin film transistor T2 is coupled to the scan line 121, the source electrode S2 of the switching thin film transistor T2 is coupled to the data line 171, the drain electrode D2 of the switching thin film transistor T2 is coupled via the operation control thin film transistor T5 to the driving voltage line 172, while also being coupled to the source electrode S1 of the driving thin film transistor T1.

The gate electrode G4 of the initialization thin film transistor T4 is coupled to the prior scan line 122, the source electrode S4 of the initialization thin film transistor T4 is coupled to the initialization voltage line 124, and the drain electrode D4 of the initialization thin film transistor T4 is coupled to the first end Cst1 of the storage capacitor Cst, to the drain electrode D3 of the compensation thin film transistor T3, and to the gate electrode G1 of the driving thin film transistor T1.

A gate electrode G7 of the bypass thin film transistor T7 is coupled to the bypass control line 128, a source electrode S7 of the bypass thin film transistor T7 is coupled to the drain electrode D6 of the light emission control thin film transistor T6 and to the anode of the OLED, and a drain electrode D7 of the bypass thin film transistor T7 is coupled to the initialization voltage line 124 and to the source electrode S4 of the initialization thin film transistor T4.

Hereinafter, operation of the bypass thin film transistor T7 of the organic light emitting diode display according to the sixth exemplary embodiment will be described.

The bypass thin film transistor T7 receives the bypass signal BP from the bypass control line 128. The bypass signal BP is a voltage (e.g., a voltage of a predetermined level) at which the bypass thin film transistor T7 can be always turned off, and the bypass thin film transistor T7 receives the voltage of a level sufficient to turn the transistor off to the gate electrode G7 to turn off the bypass transistor T7, and allow a portion of the driving current Id to flow as a bypass current Ibp through the bypass transistor T7.

When the minimum current of the driving thin film transistor T1 for displaying a black image flows as the driving current Id, if the OLED emits light, the black image is not ideally displayed. Accordingly, the bypass thin film transistor T7 of the organic light emitting diode display according to the sixth exemplary embodiment may disperse, or divert, a portion of the minimum current of the driving thin film transistor T1 as a bypass current Ibp to a current path other than the current path of the organic light emitting diode. Herein, the minimum current of the driving thin film transistor refers to a current when the gate-source voltage Vgs of the driving thin film transistor T1 is smaller than the threshold voltage Vth, thus turning off the driving thin film transistor. The minimum driving current (e.g., current of 10 pA or less) when the driving thin film transistor is turned off is transferred to the organic light emitting diode to be displayed as an image of black luminance.

When the minimum driving current displaying the black image flows, a bypass transferring effect of the bypass current Ibp is large, but when the large driving current for displaying an image (such as a general image or a white image) flows, an effect of the bypass current Ibp is hardly present. Accordingly, when the driving current displaying the black image flows, a light emitting current Ioled of the organic light emitting diode, which corresponds to the driving current Id reduced by the bypass current Ibp through the bypass thin film transistor T7, has the minimum required current at which the black image can be displayed.

Accordingly, a contrast ratio may be improved by implementing a precise black luminance image by using the bypass thin film transistor T7.

A structure of the pixel of the organic light emitting diode display shown in FIG. 10 will be described with reference to FIG. 11 together with FIGS. 10 and 3. FIG. 11 is a layout view of the organic light emitting diode display according to the sixth exemplary embodiment.

As shown in FIGS. 10 and 11, the pixel of the organic light emitting diode display according to the sixth exemplary embodiment includes the scan line 121, the prior scan line 122, the light emission control line 123, the initialization voltage line 124, and the bypass control line 128 formed in a row direction for respectively applying the scan signal Sn, the prior scan signal Sn-1, the light emission control signal En, the initialization voltage Vint, and the bypass signal BP, and also includes the data line 171 and the driving voltage line 172 crossing the scan line 121, the prior scan line 122, the light emission control line 123, the initialization voltage line 124, and the bypass control line 128, and for respectively applying the data signal Dm and the driving voltage ELVDD to the pixel.

Further, in the pixel, the driving thin film transistor T1, the switching thin film transistor T2, the compensation thin film transistor T3, the initialization thin film transistor T4, the operation control thin film transistor T5, the light emission control thin film transistor T6, the bypass thin film transistor T7, the storage capacitor Cst, and the OLED 70 are formed.

The driving thin film transistor T1, the switching thin film transistor T2, the compensation thin film transistor T3, the initialization thin film transistor T4, the operation control thin film transistor T5, the light emission control thin film transistor T6, and the bypass thin film transistor T7 are formed along the semiconductor layer 131, which is bent to have various shapes. The semiconductor layer 131 may be formed of, for example, polysilicon, and includes a channel region not doped with an impurity, and a source region and a drain region formed at respective sides of the channel region and doped with an impurity. Herein, the impurity corresponds to a kind of thin film transistor, such as, for example, an N-type impurity or a P-type impurity. The semiconductor layer 131 includes the driving semiconductor layer 131*a* formed in the driving thin film transistor T1, the switching semiconductor layer 131*b* formed in the switching thin film transistor T2, the compensation semiconductor layer 131*c* formed in the compensation thin film transistor T3, the initialization semiconductor layer 131*d* formed in the initialization thin film transistor T4, the operation control semiconductor layer 131*e* formed in the operation control thin film transistor T5, the light emission control semiconductor layer 131*f* formed in the light emission control thin film transistor T6, and a bypass semiconductor layer 131*g* formed in the bypass thin film transistor T7.

The driving thin film transistor T1 includes the driving semiconductor layer 131a, the driving gate electrode 125a, the driving source electrode 176a, and the driving drain electrode 177a. The driving semiconductor layer 131a is bent, and includes a plurality of first extension portions 31 extending in a first direction, a plurality of second extension portions 32 extending in a second direction that is different from the first direction, and a plurality of bent portions 33 coupling respective ones of the first extension portions 31 and the second extension portions 32. Accordingly, the driving semiconductor layer 131a may be in a zigzag form. The driving semiconductor layer 131a shown in FIGS. 2 and 3 includes three first extension portions 31, two second extension portions 32, and four bent portions 33. Accordingly, the driving semiconductor layer 131a may be longitudinally in a form, or in a z form.

As described above, the driving semiconductor layer 131a may be longitudinally formed in a narrow space by forming the driving semiconductor layer 131a including a plurality of bent portions 33. Accordingly, since the driving channel region 131a1 of the driving semiconductor layer 131a may be longitudinally formed, the driving range of the gate voltage applied to the driving gate electrode 125a is broadened. Therefore, since the driving range of the gate voltage is relatively broad, a gray level of light emitted from an OLED can be more finely, or precisely, controlled by changing or adjusting the magnitude of the gate voltage, and as a result, it is possible to increase a resolution of the organic light emitting diode display and to improve display quality.

The bypass thin film transistor T7 includes the bypass semiconductor layer 131g, the bypass gate electrode 125g, the bypass source electrode 176g, and the bypass drain electrode 177g. The bypass source electrode 176g corresponds to the bypass drain region 177g doped with the impurity in the bypass semiconductor layer 131g, and the bypass drain electrode 177g corresponds to the bypass drain region 177g doped with the impurity in the bypass semiconductor layer 131g. The bypass source electrode 176g is directly coupled to the light emission control drain region 133f.

The bypass semiconductor layer 131g is formed on the same layer as the driving semiconductor layer 131a, the switching semiconductor layer 131b, the light emission control semiconductor layer 131f, and the like. The first gate insulating layer 141 is formed on the bypass semiconductor layer 131g. The bypass gate electrode 125g, which is a portion of the bypass control line 128, is formed on the first gate insulating layer 141, and the second gate insulating layer 142 is formed on the bypass gate electrode 125g and the first gate insulating layer 141.

Accordingly, the bypass thin film transistor T7 receives the bypass signal BP from the bypass control line 128 to always turn off the bypass transistor T7, and a portion of the driving current Id is emitted under an off state as the bypass current Ibp through the bypass transistor T7 to the outside. Accordingly, when the driving current displaying the black image flows, a contrast ratio may be improved by implementing a more precise black luminance image.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

DESCRIPTION OF SOME OF THE REFERENCE CHARACTERS

| | |
|---|---|
| 31: First extension portion | 32: Second extension portion |
| 33: Bent portion | 110: Substrate |
| 121: Scan line | 122: Prior scan line |
| 123: Light emission control line | 124: Initialization voltage line |
| 125a: Driving gate electrode | 125b: Switching gate electrode |
| 131a: Driving semiconductor layer | 132b: Switching semiconductor layer |
| 141: First gate insulating layer | 142: Second gate insulating layer |
| 171: Data line | 172: Driving voltage line |

What is claimed is:

1. An organic light emitting diode display comprising:
a substrate;
a scanning line on the substrate;
a data line crossing the scanning line;
a first thin film transistor coupled to the scanning line and the data line;
a first voltage line crossing the scanning line;
an organic light emitting diode;
a second thin film transistor;
a third thin film transistor;
a fourth thin film transistor;
a second voltage line crossing the data line and the first voltage line;
a fifth thin film transistor electrically coupled to the fourth thin film transistor, the organic light emitting diode, and the second voltage line; and
a storage capacitor electrically coupled to a gate electrode of the third thin film transistor,
wherein the second thin film transistor, the third thin film transistor, and the fourth thin film transistor are successively electrically coupled to each other from the first voltage line to the organic light emitting diode, and
wherein the third thin film transistor is electrically coupled to the first thin film transistor.

2. The organic light emitting diode display of claim 1, wherein the second thin film transistor, the third thin film transistor, and the fourth thin film transistor are electrically coupled by a semiconductor layer.

3. The organic light emitting diode display of claim 2, wherein the fifth thin film transistor is electrically coupled by the semiconductor layer.

4. The organic light emitting diode display of claim 3, further comprising a sixth thin film transistor electrically coupled to the gate electrode of the third thin film transistor.

5. The organic light emitting diode display of claim 4, further comprising a pixel electrode electrically coupled to the organic light emitting diode.

6. The organic light emitting diode display of claim 5, wherein the pixel electrode overlaps the storage capacitor.

7. The organic light emitting diode display of claim 1, wherein the storage capacitor comprises a first metal layer comprising the gate electrode of the third thin film transistor, an insulating layer over the first metal layer, and a second metal layer over the first metal layer.

8. The organic light emitting diode display of claim 7, wherein the second thin film transistor, the third thin film transistor, and the fourth thin film transistor are electrically coupled by a semiconductor layer.

9. The organic light emitting diode display of claim 8, wherein the fifth thin film transistor is electrically coupled by the semiconductor layer.

10. The organic light emitting diode display of claim 9, further comprising a sixth thin film transistor electrically coupled to the gate electrode of the third thin film transistor.

11. The organic light emitting diode display of claim 10, further comprising a pixel electrode electrically coupled to the organic light emitting diode.

12. The organic light emitting diode display of claim 11, wherein the pixel electrode overlaps the storage capacitor.

13. The organic light emitting diode display of claim 1, further comprising:
   a third voltage line crossing the data line and the first voltage line;
   a sixth thin film transistor electrically coupled to the gate electrode of the third thin film transistor; and
   a seventh thin film transistor electrically coupled to the sixth thin film transistor and the third voltage line,
   wherein the third voltage line is electrically connected to the second voltage line through the second thin film transistor, the third thin film transistor, the fourth thin film transistor, the fifth thin film transistor, the sixth thin film transistor, and the seventh thin film transistor.

14. The organic light emitting diode display of claim 13, wherein the second thin film transistor, the third thin film transistor, and the fourth thin film transistor are electrically coupled by a semiconductor layer.

15. The organic light emitting diode display of claim 14, wherein the fifth thin film transistor is electrically coupled by the semiconductor layer.

16. The organic light emitting diode display of claim 15, further comprising a pixel electrode electrically coupled to the organic light emitting diode.

17. The organic light emitting diode display of claim 16, wherein the pixel electrode overlaps the storage capacitor.

18. The organic light emitting diode display of claim 13, wherein the storage capacitor comprises a first metal layer comprising the gate electrode of the third thin film transistor, an insulating layer over the first metal layer, and a second metal layer over the first metal layer.

19. The organic light emitting diode display of claim 18, wherein the second thin film transistor, the third thin film transistor, and the fourth thin film transistor are electrically coupled by a semiconductor layer.

20. The organic light emitting diode display of claim 19, wherein the fifth thin film transistor is electrically coupled by the semiconductor layer.

21. The organic light emitting diode display of claim 20, further comprising a pixel electrode electrically coupled to the organic light emitting diode.

22. The organic light emitting diode display of claim 21, wherein the pixel electrode overlaps the storage capacitor.

23. The organic light emitting diode display of claim 1, further comprising a semiconductor layer curved under a gate electrode of the second thin film transistor.

24. The organic light emitting diode display of claim 23, wherein the second thin film transistor, the third thin film transistor, and the fourth thin film transistor are electrically coupled by the semiconductor layer.

25. The organic light emitting diode display of claim 24, wherein the fifth thin film transistor is electrically coupled by the semiconductor layer.

26. The organic light emitting diode display of claim 25, further comprising a sixth thin film transistor electrically coupled to the gate electrode of the third thin film transistor.

27. The organic light emitting diode display of claim 23, wherein the storage capacitor comprises a first metal layer comprising the gate electrode of the third thin film transistor, an insulating layer over the first metal layer, and a second metal layer over the first metal layer.

28. The organic light emitting diode display of claim 27, wherein the second thin film transistor, the third thin film transistor, and the fourth thin film transistor are electrically coupled by the semiconductor layer.

29. The organic light emitting diode display of claim 28, wherein the fifth thin film transistor is electrically coupled by the semiconductor layer.

30. The organic light emitting diode display of claim 29, further comprising a sixth thin film transistor electrically coupled to the gate electrode of the third thin film transistor.

31. The organic light emitting diode display of claim 30, further comprising a pixel electrode electrically coupled to the organic light emitting diode.

32. The organic light emitting diode display of claim 31, wherein the pixel electrode overlaps the storage capacitor.

* * * * *